United States Patent
Lim et al.

(10) Patent No.: US 10,468,264 B2
(45) Date of Patent: Nov. 5, 2019

(54) METHOD OF FABRICATING SEMICONDUCTOR DEVICE

(71) Applicant: SAMSUNG ELECTRONICS CO., LTD., Suwon-si, Gyeonggi-do (KR)

(72) Inventors: Jae Soon Lim, Seoul (KR); Gyu Hee Park, Hwaseong-si (KR); Youn Joung Cho, Hwaseong-si (KR); Hyun Suk Lee, Hwaseong-si (KR); Gi Hee Cho, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 156 days.

(21) Appl. No.: 15/613,737

(22) Filed: Jun. 5, 2017

(65) Prior Publication Data

US 2018/0005836 A1     Jan. 4, 2018

(30) Foreign Application Priority Data

Jul. 4, 2016   (KR) .................. 10-2016-0084321
Mar. 3, 2017   (KR) .................. 10-2017-0027647

(51) Int. Cl.
| | |
|---|---|
| *H01L 21/30* | (2006.01) |
| *C30B 25/14* | (2006.01) |
| *C30B 29/06* | (2006.01) |
| *H01L 21/768* | (2006.01) |
| *H01L 23/29* | (2006.01) |
| *H01L 23/528* | (2006.01) |

(52) U.S. Cl.
CPC .............. *H01L 21/30* (2013.01); *C30B 25/14* (2013.01); *C30B 29/06* (2013.01); *H01L 21/76829* (2013.01); *H01L 21/76834* (2013.01); *H01L 23/291* (2013.01); *H01L 23/528* (2013.01); *H01L 23/5283* (2013.01)

(58) Field of Classification Search
CPC ......... H01L 21/76843; H01L 21/28556; H01L 21/022; H01L 21/76846; H01L 21/76877; C30B 25/02; C30B 25/165
See application file for complete search history.

(56) References Cited

U.S. PATENT DOCUMENTS

| | | | |
|---|---|---|---|
| 5,789,028 A | 8/1998 | Zhao et al. | |
| 5,946,594 A * | 8/1999 | Iyer | ........................ C23C 16/08 257/E21.168 |
| 7,824,743 B2 | 11/2010 | Lee et al. | |
| 9,076,647 B2 | 7/2015 | Chung et al. | |
| 2003/0003696 A1 * | 1/2003 | Gelatos | ............... C23C 16/4405 438/485 |

(Continued)

FOREIGN PATENT DOCUMENTS

| | | |
|---|---|---|
| JP | 2000-252261 | 9/2000 |
| JP | 2014-093331 | 5/2014 |

(Continued)

*Primary Examiner* — Matthew J Song
(74) *Attorney, Agent, or Firm* — Volentine, Whitt & Francos, PLLC

(57) ABSTRACT

A method of fabricating a semiconductor device includes feeding a suppression gas, a source gas, a reactive gas, and a purge gas including an inert gas, into a process chamber in which a substrate is disposed. The suppression gas suppresses the physical adsorption of the source gas onto the substrate. As a result, a thin film is formed on the substrate.

14 Claims, 18 Drawing Sheets

(56) References Cited

U.S. PATENT DOCUMENTS

| | | | | |
|---|---|---|---|---|
| 2009/0035466 A1* | 2/2009 | Kawano | ............... | C23C 16/045 |
| | | | | 427/255.28 |
| 2012/0071006 A1* | 3/2012 | Kang | ................... | C23C 16/045 |
| | | | | 438/788 |
| 2012/0077322 A1* | 3/2012 | Hirota | ............... | H01L 21/02178 |
| | | | | 438/381 |
| 2012/0276721 A1* | 11/2012 | Chung | .............. | H01L 21/02164 |
| | | | | 438/483 |
| 2013/0075912 A1* | 3/2013 | Wakatsuki | ........ | H01L 21/28556 |
| | | | | 257/753 |
| 2014/0175354 A1* | 6/2014 | Wang | ................. | H01L 45/1253 |
| | | | | 257/2 |
| 2015/0228496 A1* | 8/2015 | Nakano | ............... | H01L 21/3081 |
| | | | | 438/785 |

FOREIGN PATENT DOCUMENTS

| | | |
|---|---|---|
| KR | 2000-0027189 | 5/2000 |
| KR | 10-0265326 B1 | 9/2000 |
| KR | 1020090113633 A | 11/2009 |
| KR | 1020110052475 A | 5/2011 |
| KR | 1020110053098 A | 5/2011 |
| KR | 1020120122887 A | 7/2012 |

* cited by examiner

METHOD OF FABRICATING SEMICONDUCTOR DEVICE

This application claims priority to Korean Patent Application No. 10-2016-0084321 filed on Jul. 4, 2016 in the Korean Intellectual Property Office, and Korean Patent Application No. 10-2017-0027647 filed on Mar. 3, 2017 in the Korean Intellectual Property Office, the inventive concept of which is incorporated herein by reference in its entirety.

BACKGROUND

1. Technical Field

The inventive concept relates to a method of fabricating a semiconductor device. More particularly, the inventive concept relates to a method of fabricating a thin film of a semiconductor device in an opening having a high aspect ratio.

2. Description of the Related Art

As semiconductor devices become more highly integrated and miniaturized, techniques for increasing the capacitance of dynamic random access memory (DRAM) devices are increasingly needed. To increase the capacitance in a limited area, various methods may be used such as using a high-k dielectric material as a dielectric layer, reducing the thickness of a dielectric layer, and increasing the effective area of a lower electrode.

To increase the effective area of a lower electrode, the lower electrode may be integrally formed, and the height of the lower electrode may be increased. That is, a cylindrical, stack-type, or concave-type lower electrode may be formed. In these cases, the lower electrode may have significant size in all three dimensions and an interior having a relatively high aspect ratio (ratio of height to width). However, there is a difficulty in forming a thin film having a uniform thickness on a three-dimensional (3D) lower electrode whose interior has a high aspect ratio.

SUMMARY

According to an aspect the present inventive concept, there is provided a method of fabricating a semiconductor device, comprising providing a substrate, and forming a thin film on the substrate by a process including feeding a suppression gas onto the substrate, feeding a source gas, feeding a reactive gas, and feeding a purge gas comprising an inert gas, and in which the suppression gas suppresses a physical adsorption of the source gas by the substrate.

According to another aspect the present inventive concept, there is provided a method of fabricating a semiconductor device, comprising forming a lower electrode layer having a three-dimensional (3D) cylindrical structure on a substrate, conformally forming a dielectric layer on the lower electrode layer, and conformally forming an upper electrode layer on the dielectric layer, and in which the forming of the upper electrode layer comprises feeding a suppression gas comprising a halogen on the substrate, feeding a source gas comprising titanium, feeding a reactive gas comprising nitrogen, and feeding a purge gas comprising an inert gas.

According to another aspect the present inventive concept, there is provided a method of fabricating a semiconductor device, comprising supporting in a process chamber a structure defining therein an opening having an aspect ratio, and a film forming process of forming a film on the structure including within the opening. The structure has an upper surface and the opening extends in the structure from the upper surface such that an internal bottom surface of the structure delimits the bottom of the opening and an internal side surface of the structure delimits a side of the opening. The film forming process conformally forms the film on the structure including on the top surface and on the internal bottom surface of the structure, and comprises feeding a source gas into the process chamber and wherein the source gas is a precursor of the film and at least some of the source gas is adsorbed by the structure at the top surface and internal bottom surface of the structure, feeding a reactive gas into the process chamber and where the reactive gas is a precursor of the film and is reacts chemically with the source gas, and feeding a suppression gas into the process chamber and wherein the suppression gas is not a precursor of the film, is not reactive with the source gas, and at least some of the suppression gas is adsorbed by the top and internal bottom surface of the structure, and feeding inert gas into the process chamber to purge the chamber of at least some of the gas that is in the process chamber and wherein the feeding of inert gas is carried out at one or more points in the film forming process after the source gas has been fed into the process chamber.

According to another aspect the present inventive concept, there is provided a semiconductor device fabricating equipment, comprising a chamber, a substrate support disposed in the chamber and having a substrate mounted thereon, a source gas supply supplying a source gas into the chamber, a reactive gas supply supplying a reactive gas into the chamber, a suppression gas supply supplying a suppression gas, which suppresses physical adsorption of the source gas onto the substrate, into the chamber, and a first purge gas supply supplying a first is purge gas into the chamber.

BRIEF DESCRIPTION OF THE DRAWINGS

These and other features and aspects of the inventive concept will be apparent from the following detailed description that follows as taken with the attached drawings.

DETAILED DESCRIPTION

Examples of the present inventive concept will be described hereinafter with reference to the accompanying drawings.

Figure 1:
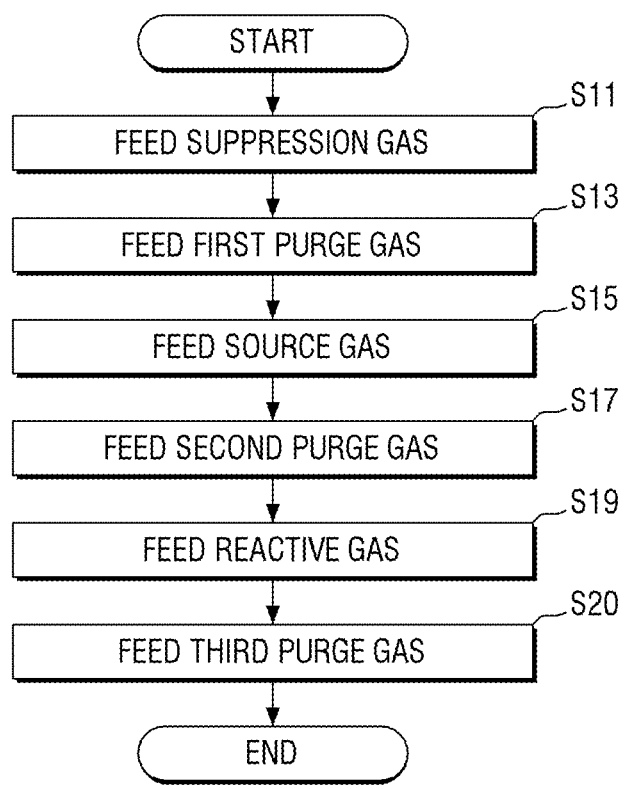
FIG. 1 is a flowchart illustrating a method of fabricating a semiconductor device according to some examples of the present inventive concept.
Figure 2:
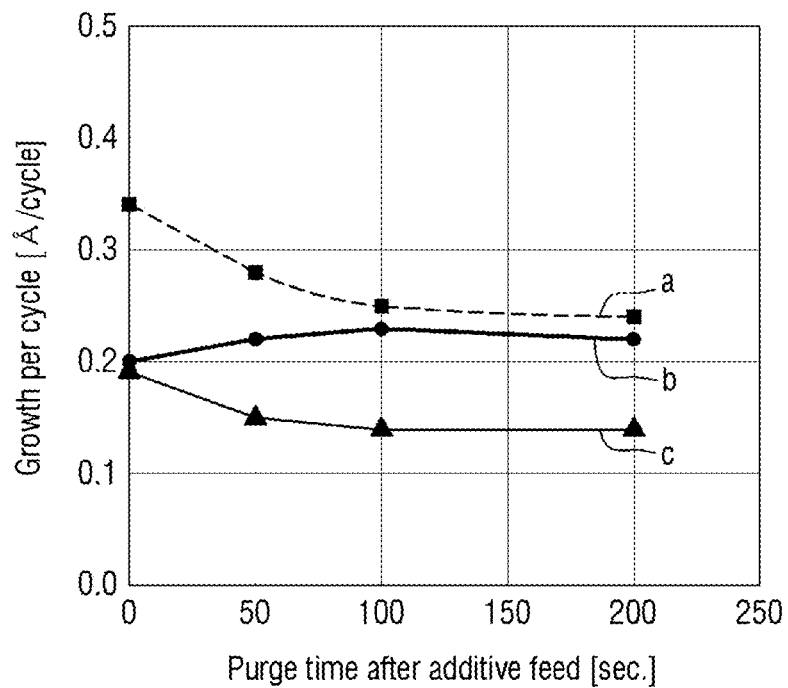
FIG. 2 is a graph illustrating the principles of a method of fabricating a semiconductor device according to some examples of the present inventive concept.
Figure 3A:
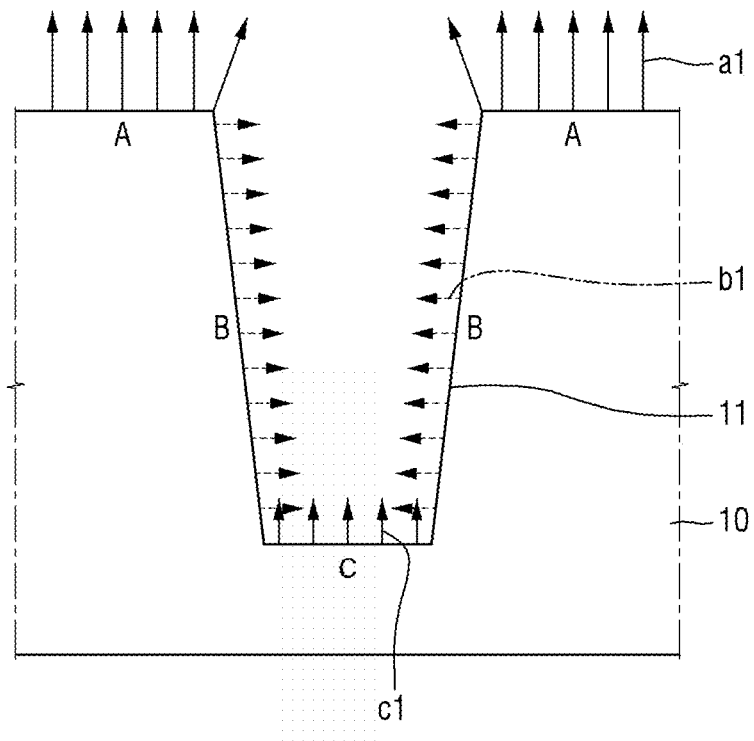
FIGS. 3A and 3B are cross-sectional views illustrating an example of a method of fabricating a semiconductor device according to the present inventive concept (FIG. 3A) and a method of fabricating a semiconductor device for comparison (FIG. 3B).
Figure 3B:
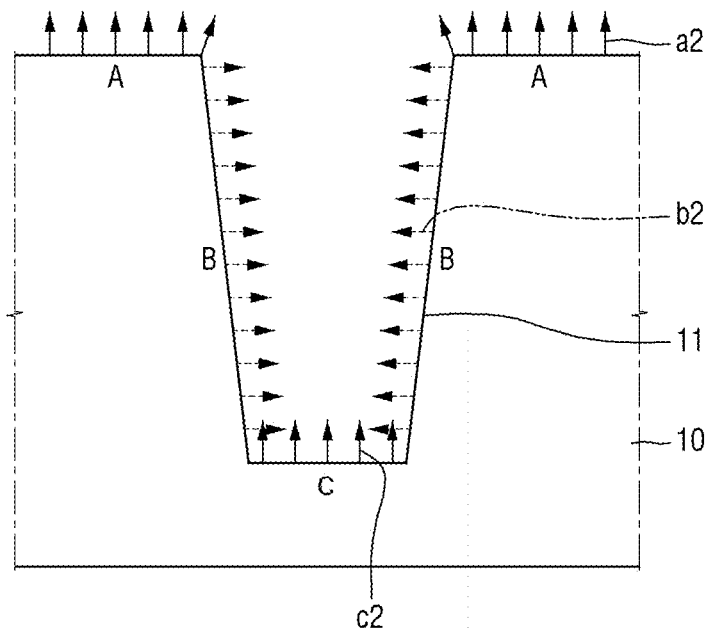
Figure 4A:
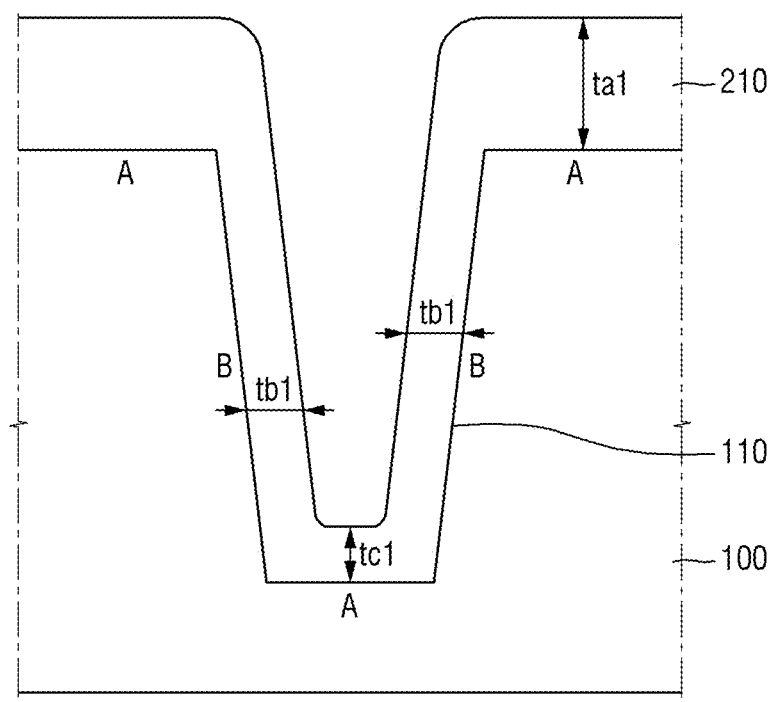
FIGS. 4A and 4B are cross-sectional views illustrating an example of a thin film formed by a method of fabricating a semiconductor device according to the present inventive concept (FIG. 4B) and an example of a thin film formed by a method for comparison (FIG. 4A).
Figure 4B:
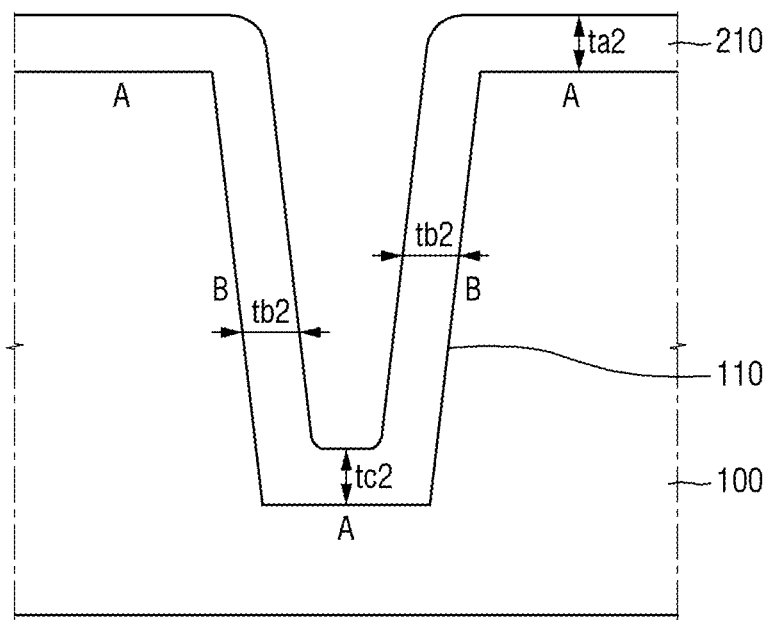

FIG. 1 is a flowchart illustrating a method of fabricating a semiconductor device according to some examples of the present inventive concept. FIG. 2 is a graph illustrating the principles of a method of fabricating a semiconductor device according to some examples of the present inventive concept. FIGS. 3A and 3B are cross-sectional views illustrating a method of fabricating a semiconductor device according to some examples of the present inventive concept. FIGS. 4A and 4B are cross-sectional views illustrating a thin film formed by a method of fabricating a semiconductor device according to some examples of the present inventive concept.

Referring to FIG. 1, an example of a method of fabricating a semiconductor device according to the inventive concept includes feeding a suppression gas (S11), feeding a source gas (S15), and feeding a reactive gas (S19) into a process chamber. The method of fabricating a semiconductor device according to the inventive concept may also include feeding a first purge gas (S13), feeding a second purge gas (S17), and feeding a third purge gas (S20) into the process chamber.

More specifically, the method of fabricating a semiconductor device according to the inventive concept may include feeding a suppression gas onto a substrate disposed in a chamber (S11), purging the suppression gas adsorbed onto the substrate using a first purge gas (S13), feeding a source gas into the chamber (S15), purging the source gas not adsorbed onto the substrate by feeding a second purge gas (S17), and feeding a reactive gas (S19) so as for the reactive gas to react with the source gas adsorbed onto the substrate, and feeding a third purge gas (S20) so as to purge a non-reactive source gas and the reactive gas and thus to form a thin film including an electrode layer on the substrate. The method of fabricating a semiconductor device according to the inventive concept may be performed by, but is not limited to, atomic layer deposition (ALD).

That is, the method of fabricating a semiconductor device according to the inventive concept may include forming a thin film. For example, the method of fabricating a semiconductor device according to the inventive concept may form an electrode on a substrate or a dielectric layer. The electrode layer may comprise a compound containing Ti and N such as, for example, TiN, TiSiN, TiAlN, TiBN, TiON, TiAlON, TiCN, TiAlCN, TiOCN, or TiSiCN.

The method of fabricating a semiconductor device according to the inventive concept will hereinafter be described taking the forming of a TiN layer as an example. However, the present inventive concept is not limited to forming a TiN layer.

The source gas and the reactive gas are precursors of the TiN film to be formed. Therefore, the feeding of a source gas, i.e., S15, may include feeding a source gas comprising a titanium-based compound. For example, the titanium-based compound may be, but is not limited to, $TiCl_4$. The feeding of a reactive gas, i.e., S19, may include feeding a reactive gas comprising a nitride-based compound. For example, the nitride-based compound may be, but is not limited to, $NH_3$.

The suppression gas has a composition different from the source gas and may not be a precursor of the film. The suppression gas may not chemically react with the reactive gas either. Specifically, the suppression gas may comprise a compound containing a halogen atom or a compound containing an unsaturated bond. For example, the suppression gas may comprise at least one of an alkyl halide, an alkenyl halide, an alkynyl halide, an alkene, an alkyne, and a combination thereof. For example, the suppression gas may comprise tetrachloro propane or dichloro ethylene.

In some examples, each of the alkyl halide, the alkenyl halide, and the alkynyl halide may include a linear, branched or cyclic halogenated hydrocarbon group containing 1 to 10 carbon atoms. Also, each of the alkene and the alkyne may include a linear, branched, or cyclic hydrocarbon group containing 1 to 10 carbon atoms.

In a case where the number of carbon atoms of the halogenated hydrocarbon group or the hydrocarbon group exceeds 10, the suppression gas may not be able to easily suppress the physical adsorption of the source gas on the substrate.

In some examples, each of the alkyl halide, the alkenyl halide, and the alkynyl halide may include 1 to 10 halogen atoms.

In a case where the number of halogen atoms of each of the alkyl halide, the alkenyl halide, and the alkynyl halide exceeds 10, the suppression gas may not be able to easily suppress the physical adsorption of the source gas on the substrate.

The suppression gas may suppress the physical adsorption of the source gas onto a substrate. Thus, in a case in which the source gas is TiCl4, the suppression gas may not contain oxygen and nitrogen and may be a gas that does not react with the source gas.

Thus, S11 may lower the speed at which the source gas is adsorbed onto a substrate where a thin film is to be formed.

FIG. 2 shows the relationship between deposition speed and purge time after the feeding of a suppression gas. Referring to FIG. 2, reference character "a" represents deposition speed when performing ALD using a $TiCl_4$ source gas and an $NH_3$ reactive gas, but not using a suppression gas, reference character "b" represents deposition speed when performing ALD using a $TiCl_4$ source gas, an $NH_3$ reactive gas, and a tetrachloropropane suppression gas, and reference character "c" represents deposition speed when performing ALD using a $TiCl_4$ source gas, an $NH_3$ reactive gas, and a dichloroethylene suppression gas.

The growth speed of a thin film when using a suppression gas is lower than when not using a suppression gas. That is, according to the present inventive concept, a suppression gas is adsorbed onto a substrate and can thus suppress the over-adsorption of a source gas. As a result, the growth speed of a thin film can be inhibited, and a conformal thin film can be formed. FIG. 2 shows that after the feeding of a suppression gas, deposition speed does not increase according to purge time, and this means that the suppression gas is not easily "desorbable" and thus its effect does not considerably decrease over time.

The forming of a conformal thin film using a method of fabricating a semiconductor device according to the present inventive concept will be described hereinafter with reference to FIGS. 3A and 3B.

FIG. 3A is a cross-sectional view showing the degree of adsorption of a source gas during the formation of a thin film using the source gas and a reactive gas, but not using a suppression gas, and FIG. 3B is a cross-sectional view showing the degree of adsorption of a source gas during the formation of a thin film using the source gas, a reactive gas, and a suppression gas.

Referring to FIGS. 3A and 3B, a substrate 10 has a hole 11 having a high aspect ratio, and an upper surface A, a lower surface B, and sidewalls B are exposed. The length of arrows illustrated in each of FIGS. 3A and 3B represents the degree of adsorption of a source gas.

That is, as illustrated in FIG. 3A, when a thin film is formed not using a suppression gas, a degree a1 of adsorption of a source gas at the upper surface A becomes higher over time than a degree c1 of adsorption of the source gas at the lower surface C.

However, as illustrated in FIG. 3B, when a thin film is formed using a suppression gas according to the present inventive concept, a degree a2 of adsorption of a source gas at the upper surface A becomes similar over time to a degree c2 of adsorption of the source gas at the lower surface C. This is because the over-adsorption of the source gas at the upper surface A is suppressed by a suppression gas. More specifically, the over-adsorption of the source gas that may occur due to the source gas being physically adsorbed onto the upper surface A can be suppressed by the suppression gas.

FIGS. 4A and 4B show the uniformity of a thin film 21 formed in the case illustrated in FIG. 3A and the uniformity of a thin film 21 formed in the case illustrated in FIG. 3B, respectively. Referring to FIGS. 4A and 4B, the thickness of the thin film 21 formed by suppressing the over-adsorption of a source gas at the upper surface 10 of the substrate 10 using a suppression gas (see FIG. 4B) is more uniform than the thickness of the thin film 21 formed not using a suppression gas (see FIG. 4A). In particular, as shown in FIG. 4A, the thickness ta1 of the thin film 21 formed on the upper surface A is significantly greater than the thickness tc1 of the thin film 21 formed on the bottom surface C and the thickness tb1 of the thin film on the sidewall surface B. On the other hand, as shown in FIG. 4B, the thickness ta2 of the thin film 21 formed on the upper surface A is substantially the same as the thickness tc2 of the thin film 21 formed on the bottom surface C. Also, the thickness ta2 of the thin film 21 formed on the upper surface A is substantially the same as the thickness tb2 of the thin film on the sidewall surface B.

Figure 5A:
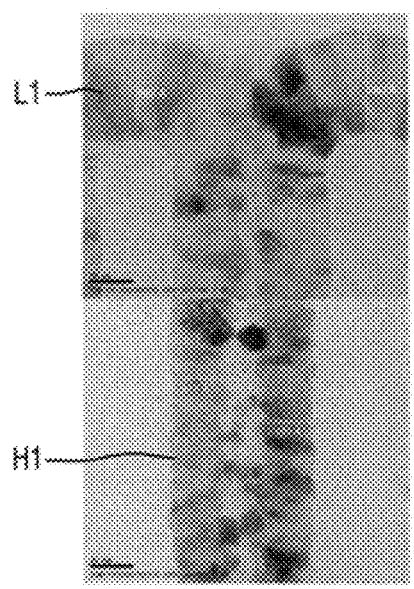
FIGS. 5A and 5B present photographs showing a thin film formed by an example of a method of fabricating a semiconductor device according to the present inventive concept (FIG. 5B) and a thin film formed by a method for comparison with the method according to the inventive concept (FIG. 5A).
Figure 5B:
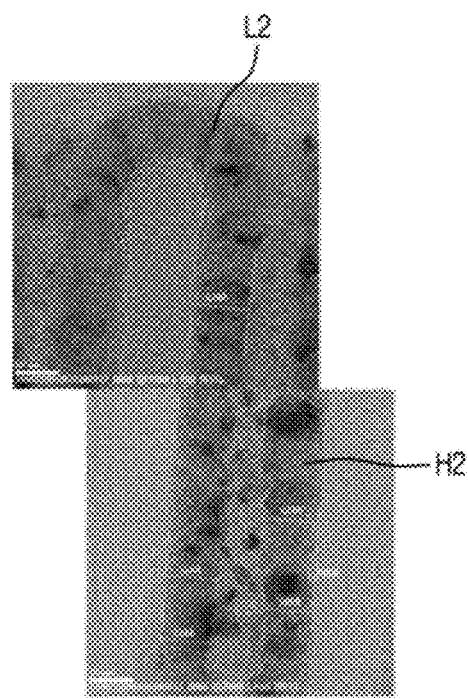

FIGS. 5A and 5B present photographs showing the thicknesses of thin films formed as illustrated in FIGS. 4A and 4B. More specifically, FIG. 5A is a photograph of a thin film L1 formed by performing ALD using a source gas and a reactive gas, but not using a suppression gas, and FIG. 5B is a photograph of a thin film L2 formed by performing ALD using a suppression gas, a source gas, and a reactive gas.

Referring to FIG. 5A, the thin film L1 is relatively thin inside a trench H1 and relatively thick outside the trench H1. On the other hand, as shown in FIG. 5B, the thin film L2 has a relatively uniform thickness on both the inside and the outside of a trench H2.

That is, a method of fabricating a semiconductor device according to some examples of the present inventive concept can form a thin film having a uniform thickness in a trench region with a high aspect ratio. The thin film may be a thin film formed in a region of any intermediate structure defining an opening having an aspect ratio, especially an opening that has a high aspect ratio. Thus, the method of fabricating a semiconductor device according to the inventive concept is applicable to thin film forming in connection with structures having, for example, a shallow trench isolation (STI), an interlayer dielectric layer (ILD), an inter-metal dielectric layer (IMD), or a cylindrical capacitor region.

Some examples of a method of fabricating a semiconductor device according to the present inventive concept will be described hereinafter taking the fabricating of a cylindrical capacitor, as an example. However, as already mentioned above, the present inventive concept is not limited to fabricating a semiconductor device including a cylindrical capacitor. That is, a method of fabricating a semiconductor device according to the present inventive concept is applicable to the forming of a thin film in a variety of different kinds of regions defining openings having high aspect ratios.

Examples of a method of fabricating a semiconductor device according to the present inventive concept will be described hereinafter in further detail with reference to FIGS. 1 and 6 through 18.

FIGS. 6 through 18 are cross-sectional views illustrating examples of a method of fabricating a semiconductor device according to the present inventive concept.

Figure 6:
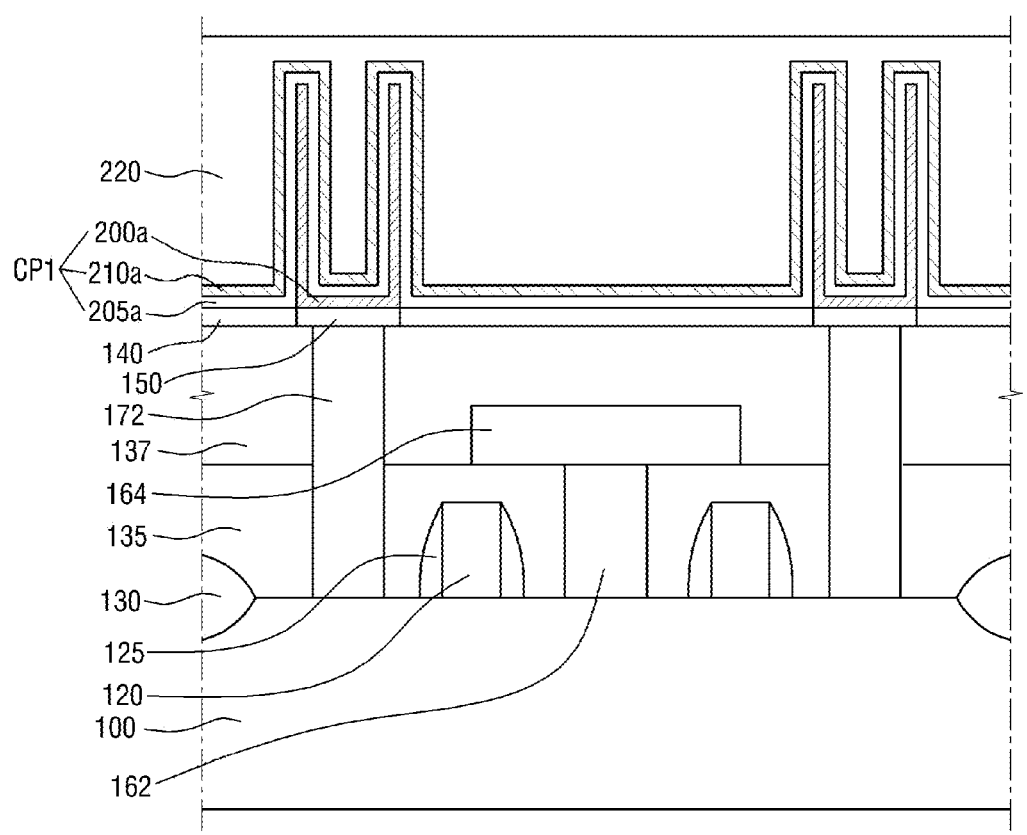
FIGS. 6, 7, 8. 9, 10, 11, 12 13, 14, 15, 16, 17 and 18 are cross-sectional views a semiconductor device during the course of its manufacture and together illustrate examples of a method of fabricating the semiconductor device according to the present inventive concept.

Referring to FIG. 6, a semiconductor device obtained by a method of fabricating a semiconductor device according to the present inventive concept may include a substrate 100, a first ILD 135, a second ILD 137, an etching stop layer 140, a conductive metal layer 150, a capacitor CP1, and a capping layer 220.

For example, the substrate 100 may have a memory cell array region and a peripheral region. A field oxide layer 130 may be formed on the substrate 100 for isolation between elements, and gate electrodes 120 having spacers 125 may also be formed on the substrate 100.

The substrate 100 may be formed of at least one semiconductor material selected from among Si, Ge, SiGe, GaP, GaAs, SiC, SiGeC, InAs, and InP, and a silicon-on-insulator (SOI) substrate may be used as the substrate 100.

The first ILD 135 may be formed on the entire surface of the substrate 100 where the gate electrodes 120 are formed. A bitline contact 162 may be formed so as to be interposed between the gate electrodes 120 to penetrate the first ILD 135. The bit line contact 162 connects the substrate 100 and a bitline 164, and the bitline 164, which is connected to the substrate 100 via the bitline contact 162, may be formed on the first ILD 135.

The second ILD 137 may be formed on the first ILD 135. A storage node contact 172, which is connected to the substrate 100 via the first and second ILDs 135 and 137, may be formed. For example, the storage node contact 172 may include a stack of a polysilicon plug, TiN, and a Ti barrier, but the present inventive concept is not limited to this example.

The etching stop layer 140 may be formed on the second ILD 137 and the storage node contact 172. More specifically, the etching stop layer 140 may prevent the etching of a mold layer (145 of FIG. 9) formed on the etching stop layer 140 from proceeding below the etching stop layer 140.

For example, the etching stop layer 140 may comprise, but is not limited to, silicon nitride. The etching stop layer 140 may comprise a different material from the mold layer (145 of FIG. 9) to prevent an etching process performed on the mold layer (145 of FIG. 9) from proceeding below the etching stop layer 140.

The conductive metal layer 150 may be disposed at the bottom of a storage node hole (153 of FIG. 11), which is formed above the storage node contact 172. That is, the conductive metal layer 150 may be disposed between the storage node hole (153 of FIG. 11) and a lower electrode layer 200a. The conductive metal layer 150 may comprise, but is not limited to, one of Ag, Au, Pt, Al, and Cu. The conductive metal layer 150 may be omitted, however, in certain examples of the capacitor formed according to the inventive concept.

In one example, the capacitor CP1 may be a one-cylinder-storage (OCS)-type capacitor. More specifically, the capacitor CP1 may be formed around the storage node hole (153 of FIG. 11), which has a substantially uniform width at both the top and the bottom of the capacitor CP1, and thus, the capacitor CP1 may also have a substantially uniform width at both the top and the bottom of the capacitor CP1. The expression an element or feature having "a substantially uniform width", as used herein, means that the width of the element or feature is substantially uniform within a predetermined range of errors that may occur during the forming of the element or feature due to inherent characteristics of the fabricating process. Alternatively, the width of the capacitor CP1 may vary from top to bottom of the capacitor CP1.

The capacitor CP1 may include the lower electrode layer 200a, a dielectric layer 205a, and an upper electrode layer 210a.

The lower electrode layer 200a may include a cylindrical lower electrode as the lower electrode of the capacitor CP1.

The lower electrode layer 200a may comprise a conductive oxide. For example, the lower electrode layer 200a may comprise Pt, Ru, Ir, PtO, $RuO_2$, $IrO_2$, $SrRuO_3$, $BaRuO_3$, $CaRuO_3$, and/or $(Ba, Sr)RuO_3$ and may be formed as a single layer or a stack of two or more layers.

The lower electrode layer 200a may also comprise a refractive metal or a refractory metal nitride. For example, the lower electrode layer 200a may comprise Ti, TiN, W, WN, Ta, TaN, HfN, ZrN, TiAlN, TaSiN, TiSiN, TaAlN, TiBN, TiON, TiAlON, TiCN, TiAlCN, and/or TiSiCN and may be formed as a single layer or a stack of two or more layers.

In a case in which the lower electrode layer 200a is formed on the conductive metal layer 150, the lower electrode layer 200a may comprise a different material from the conductive metal layer 150. That is, the lower electrode layer 200a and the conductive metal layer 150 may comprise different materials so as to be properly distinct from each other while not affecting each other physically and chemically.

The dielectric layer 205a may be formed on the lower electrode layer 200a. More specifically, the dielectric layer 205a may be formed on the outer sidewalls, the inner sidewall, and the inner bottom surface of the lower electrode layer 200a and on the etching stop layer 140.

The dielectric layer 205a may comprise a three or more component dielectric material. For example, the dielectric layer 205a may include $(Ba, Sr)TiO_3(BST)$, $SrTiO_3$, $BaTiO_3$, PZT, PLZT, $(Ba, Sr)(Zr, Ti)O_3(BSZTO)$, $Sr(Zr, Ti)O_3(SZTO)$, $Ba(Zr, Ti)O_3(BZTO)$, $(Ba, Sr)ZrO_3(BSZO)$, $SrZrO_3$, or $BaZrO_3$. Alternatively, the dielectric layer 205a may comprise a two component dielectric material such as $ZrO_2$, $HfO_2$, $Al_2O_3$, $Ta_2O_5$, or $TiO_2$ and may be formed by using any one of these materials alone or stacking two or more of these materials.

The upper electrode layer 210a may include the upper electrode of the capacitor CP1.

More specifically, the upper electrode layer 210a may conformally cover the dielectric layer 205a and may have the same surface profile as the dielectric layer 205a.

The upper electrode layer 210a may comprise a material having a high work function such as Pt, Ru, or Ir. In examples in which the upper electrode layer 210a includes material having a high work function, the difference in work function between the upper electrode layer 210a and the dielectric layer 205a may increase, and as a result, a leakage current of the capacitor CP1 may be controlled.

The upper electrode layer 210a may comprise a conductive oxide. For example, the upper electrode layer 210a may comprise Pt, Ru, Ir, PtO, $RuO_2$, $IrO_2$, $SrRuO_3$, $BaRuO_3$, $CaRuO_3$, and/or $(Ba, Sr)RuO_3$ and may be formed as a single layer or a stack of two or more layers.

The capping layer 220 may be formed on the upper electrode layer 210a to suppress the grain growth and agglomeration of the upper electrode layer 210a. To this end, the capping layer 220 may comprise $ZrO_2$, $Al_2O_3$, $HfO_2$, $LaAlO_3$, $BaZrO_3$, $SrZrO_3$, BST, $SrTiO_3$, $BaTiO_3$, $TiO_2$, and/or $SiO_2$ and may be formed as a single layer or a stack of two or more layers.

An example of basic structure of a semiconductor device produced by a method of fabricating a semiconductor device according to the present inventive concept has been described above with reference to FIG. 6. The lower electrode layer 200a, the dielectric layer 205a, and the upper electrode layer 210a will hereinafter be described in further detail with reference to FIGS. 7 through 18.

Figure 7:
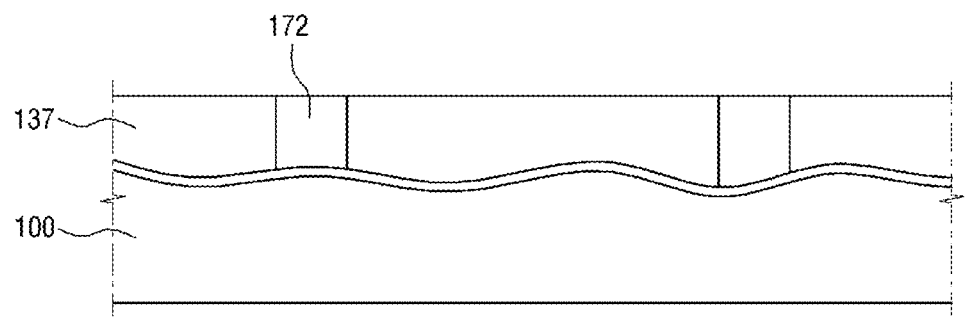

Referring to FIG. 7, a contact hole is formed by partially etching the second ILD 137, which is formed on the substrate 100. Subsequently, the storage node contact 172 is formed by filling the contact hole with a conductive material and performing planarization such that the top surface of the second ILD 137 is exposed.

Although not illustrated, the structure depicted by FIG. 7 includes all of the structure below the etching stop layer 140 as illustrated in FIG. 6. That is, FIG. 7 is for illustrating processes, which are conventional per se, followed by the forming of the etching stop layer 140.

Figure 8:
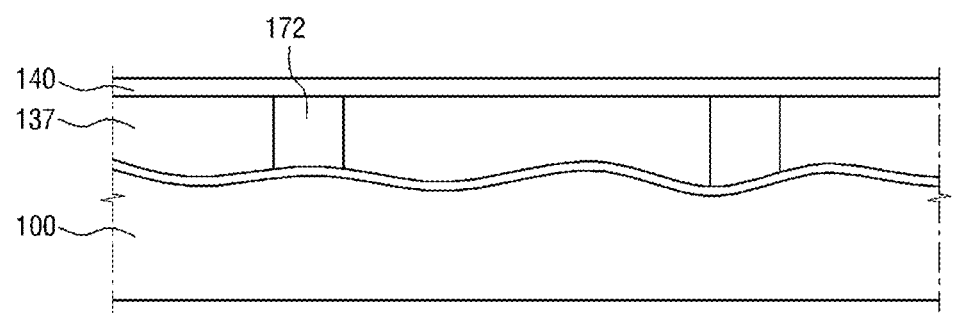

Referring to FIG. 8, the etching stop layer 140 is formed on the second ILD 137.

For example, the etching stop layer 140 may be formed of, but is not limited to, silicon nitride. The etching stop layer 140 may be formed by depositing silicon nitride through chemical vapor deposition (CVD).

Figure 9:
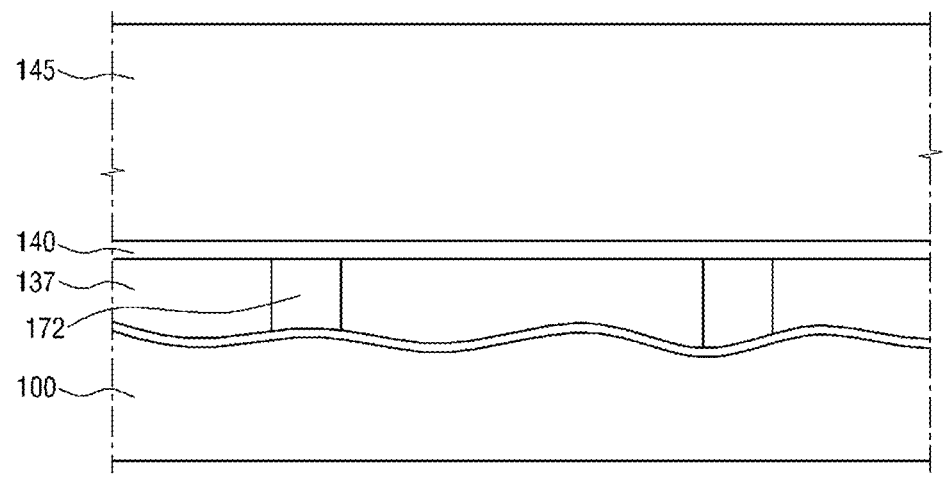

Referring to FIG. 9, the mold layer 145 is formed on the etching stop layer 140.

The mold layer 145 is provided to form the lower electrode of the capacitor CP1. Thus, the mold layer 145 may be formed to be as high as or higher than the lower electrode of the capacitor CP1.

The mold layer 145 may be formed of a material having an etching selectivity with respect to the etching stop layer 140, i.e. etches at a higher rate in the presence of a given etchant. Also, the mold layer 145 may be formed of a material that can be easily removed by a wet etching process that will be described later. For example, the mold layer 145 may be formed of, but is not limited to, polysilicon.

Figure 10:
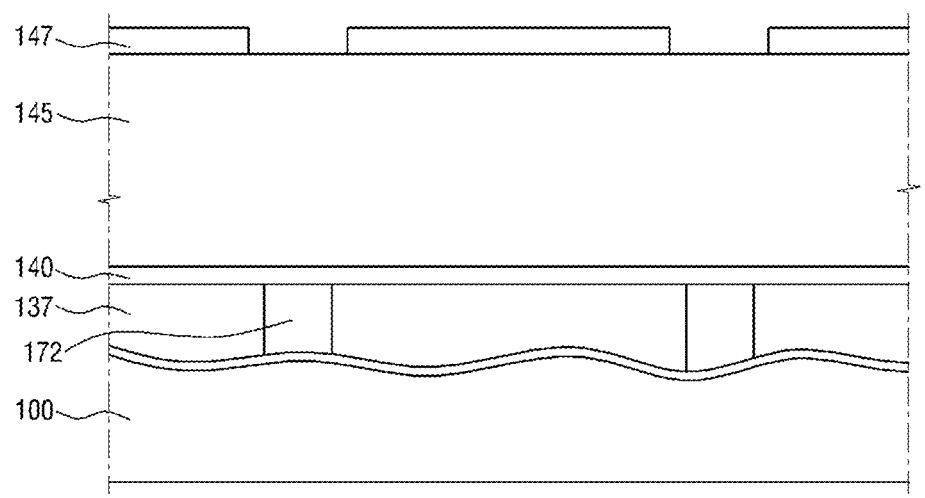

Referring to FIG. 10, a mask pattern 147 is formed on the mold layer 145.

Figure 13:
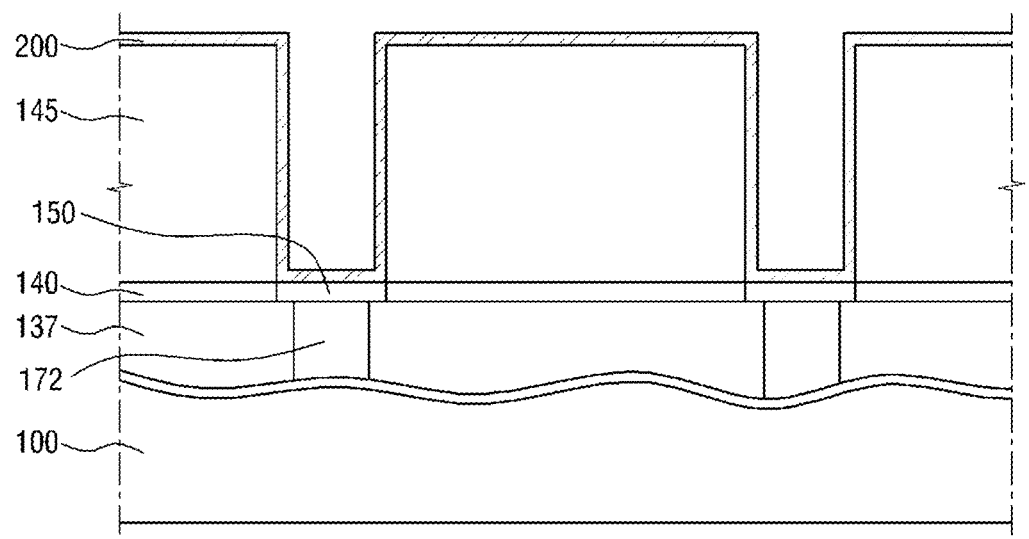

More specifically, the mask pattern 147, which serves as a mask during the etching of the mold layer 145, may be formed to have an opening therethrough of substantially the same width as the storage node hole (153 of FIG. 13). The expression that two elements or features have "substantially the same width", as used herein, is used to describe that the widths of the two elements or features are substantially equal within a range of errors that may occur during the forming of the two elements or features as a result of characteristics inherent in the fabricating process.

Figure 11:
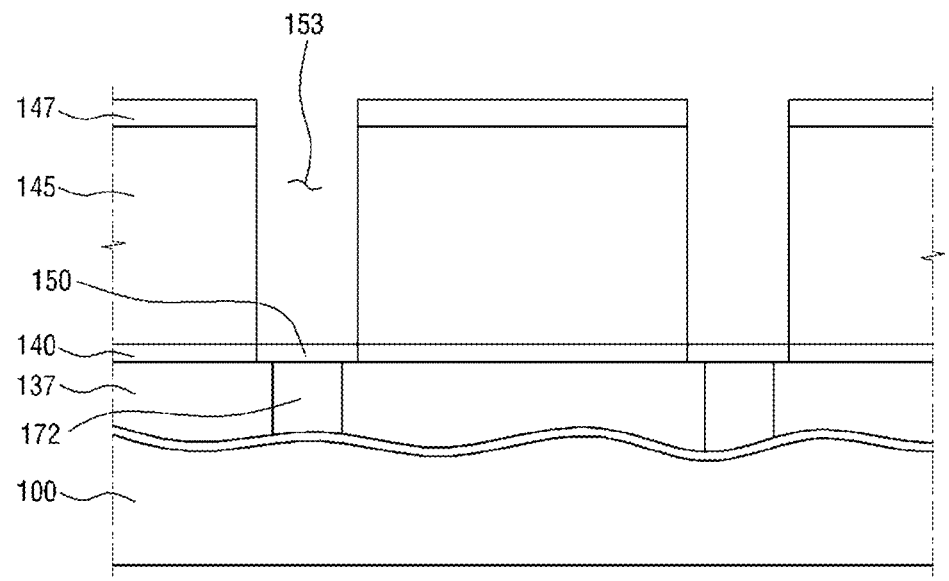
Figure 12:
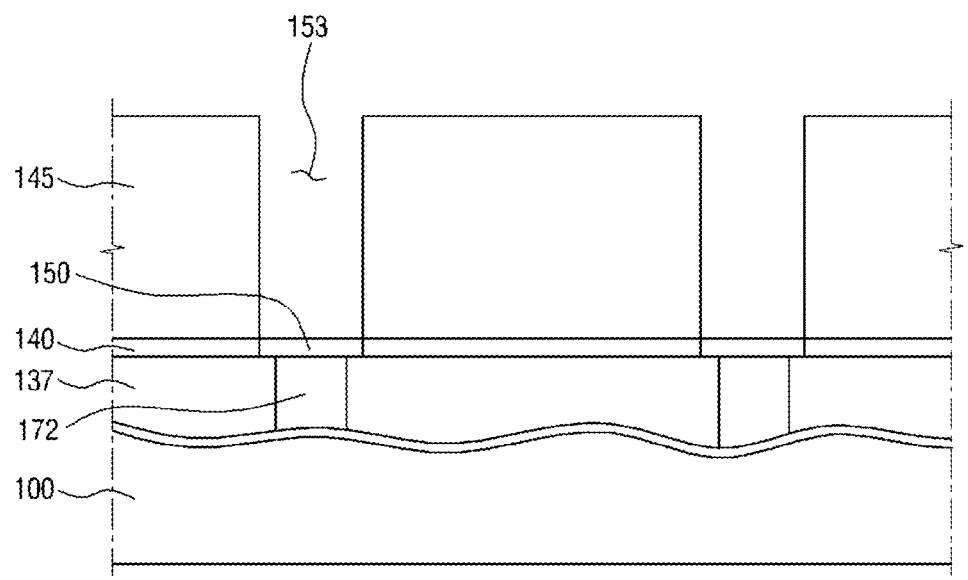

Referring to FIGS. 11 and 12, the mold layer 145 is etched using the mask pattern 147 as an etching mask.

More specifically, the top surface of the storage node contact 172 is exposed by wet-etching the mold layer 145 using the mask pattern 147 as an etching mask. Subsequently, the conductive metal layer 150 may be formed on the exposed top surface of the storage node contact 172, but the present inventive concept is not limited to this example. That is, the conductive metal layer 150 may be omitted.

After the storage node hole 153 has been formed, the mask pattern 147 may be removed.

Referring to FIG. 13, a first electrode layer 200 is formed along the sides and the bottom of the storage node hole (153 of FIG. 12) and the top surface of the mold layer 145.

More specifically, the first electrode 200 may be formed to have the same profile as the the storage node hole 153 and the top surface of a capacitor layer 145 and not to fill the storage node hole 153.

The first metal layer 200 may comprise, but is not limited to, a metal and/or a conductive oxide. That is, the first electrode layer 200 may comprise Pt, Ru, Jr, PtO, $RuO_2$, $IrO_2$, $SrRuO_3$, $BaRuO_3$, $CaRuO_3$, and/or $(Ba, Sr)RuO_3$ and may be formed as a single layer or a stack of two or more layers.

The first electrode layer 200 may also comprise a metal nitride. For example, the first electrode layer 200 may comprise Ti, TiN, W, WN, Ta, TaN, HfN, ZrN, TiAlN, TaSiN, TiSiN, TaAlN, TiBN, TiON, TiAlON, TiCN, TiAlCN, and/or TiSiCN and may be formed as a single layer or a stack of two or more layers.

The first electrode layer 200 may be formed by ALD, CVD, or physical vapor deposition (PVD). The first electrode layer 200 is preferably be formed by ALD, which provides excellent step coverage properties.

That is, the first electrode layer 200 may be formed by a method of fabricating a semiconductor device according to the present inventive concept.

More specifically and referring to FIGS. 1 and 13, the forming of the first electrode layer 200 on the sides and the bottom of the storage node hole 153 and on the top surface of the capacitor layer 145 may include feeding a suppression gas into the chamber of an ALD device and in which the substrate 100 is disposed (S11).

The feeding of a suppression gas, i.e., S11, may include feeding a suppression gas comprising a compound containing a halogen atom or a compound containing an unsaturated bond. For example, the suppression gas may comprise at least one of an alkyl halide, an alkenyl halide, an alkynyl halide, an alkene, an alkyne, and a combination thereof. The suppression gas does not contain oxygen and nitrogen, and may be a gas that does not react with a source gas.

The suppression gas is fed into the chamber for a predetermined amount of time sufficient for at least some of the suppression gas to be physically and/or chemically adsorbed onto the surfaces defining the sides and bottom of the storage node hole 153 and the top surface of the capacitor layer 145. A portion of the suppression gas fed into the chamber may remain unabsorbed in the chamber, i.e., is not physically and/or chemically adsorbed onto the surfaces defining the sides and bottom of the storage node hole 153 and the top surface of the capacitor layer 145.

Subsequently, the suppression gas, not adsorbed physically and/or chemically onto the surfaces defining the sides and bottom of the storage node hole 153 and the top surface of the capacitor layer 145, is purged by feeding a first purge gas (S13). An inert gas may be used as the first purge gas and may be Ar, He, Kr, Xe, $N_2$, or a combination thereof. Alternatively, the suppression gas may be purged by performing a pumping process (e.g., a vacuum pumping process of creating a vacuum or negative pressure in the process chamber using a vacuum pump attached to an outlet of the process chamber). As still another alternative, the suppression gas may be purged by performing both the feeding of the first purge gas and the pumping process.

Subsequently, a source gas is fed into the chamber (S15).

The source gas is fed into the chamber for a predetermined amount of time sufficient for at least some of the source gas to react with, or to be chemically adsorbed onto, the surfaces defining the sides and the bottom of the storage node hole 153 and the top surface of the capacitor layer 145. Another portion of the source gas may remain unabsorbed in the chamber.

Because the suppression gas is already adsorbed on the surfaces defining the sides and is the bottom of the storage node hole 153 and on the top surface of the capacitor layer 145, the physical adsorption of the source gas may be suppressed.

The feeding of the source gas may include feeding a source gas comprising a titanium-based compound. For example, the titanium-based compound may be, but is not limited to, $TiCl_4$. An inert gas may be fed together with the source gas. For example, the inert gas may be Ar, He, Kr, Xe, $N_2$, or a combination thereof.

To purge the source gas not reacted with the substrate 100, a second purge gas may be fed (S17).

The purging of the source gas may be performed by feeding the second purge gas. An inert gas may be used as the second purge gas. For example, the inert gas may be Ar, He, Kr, Xe, N2, or a combination thereof. Alternatively, the source gas may be purged by performing a pumping process. As another alternative, the source gas may be purged by performing both the feeding of the second purge gas and the pumping process.

Subsequently, an electric field is formed perpendicularly to the substrate 100 by applying a bias to the substrate 100. The application of a bias to the substrate 100 may be performed in various manners. For example, an electric field may be formed perpendicularly to the substrate 100 by applying a bias to electrodes installed at the top and the bottom of the process chamber. Alternatively, an electric field may be formed perpendicularly to the substrate 100 by applying a bias to the top and the bottom of a chuck on which the substrate 100 is supported. The direction of an electric field to be formed typically will depend on the type of reactive gas to be fed.

Subsequently, a reactive gas is fed into the chamber (S19).

The reactive gas may be fed into the chamber and may then be transformed into plasma with an electric field formed perpendicularly to the substrate 100.

The reaction gas transformed into plasma may have an unstable energy state but may be highly reactive.

The reaction gas transformed into plasma reacts with the electric field formed perpendicularly to the substrate 100 and the source gas adsorbed on the sidewalls and the bottom surface of the storage node hole 153 and the top surface of the capacitor layer 145, and as a result, the first electrode layer 200 is formed.

Some of the reactive gas that does not react is purged. An example of a method of fabricating a semiconductor device according to the present inventive concept includes repeating the above-described steps, i.e., performing more than one cycle each comprising the above-described steps, until a thin film having a desired thickness is formed.

The forming of a thin film by forming an electric field perpendicularly to (un upper surface of) the substrate 100 has been described, but the electric field may be formed in a direction that is oblique with respect to (un upper surface of) the substrate 100 for a more efficient deposition of a thin film.

Figure 14:
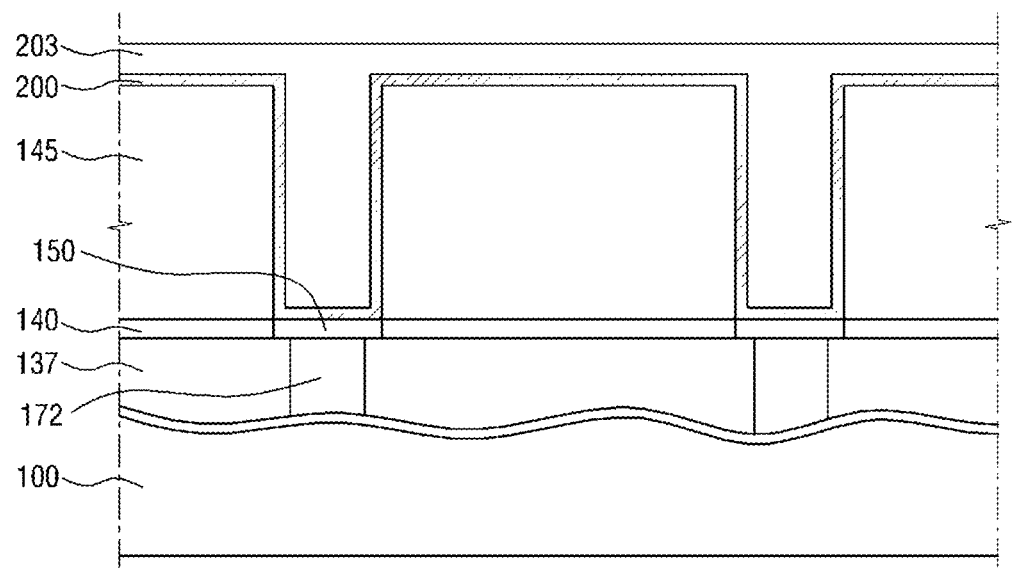
Figure 15:
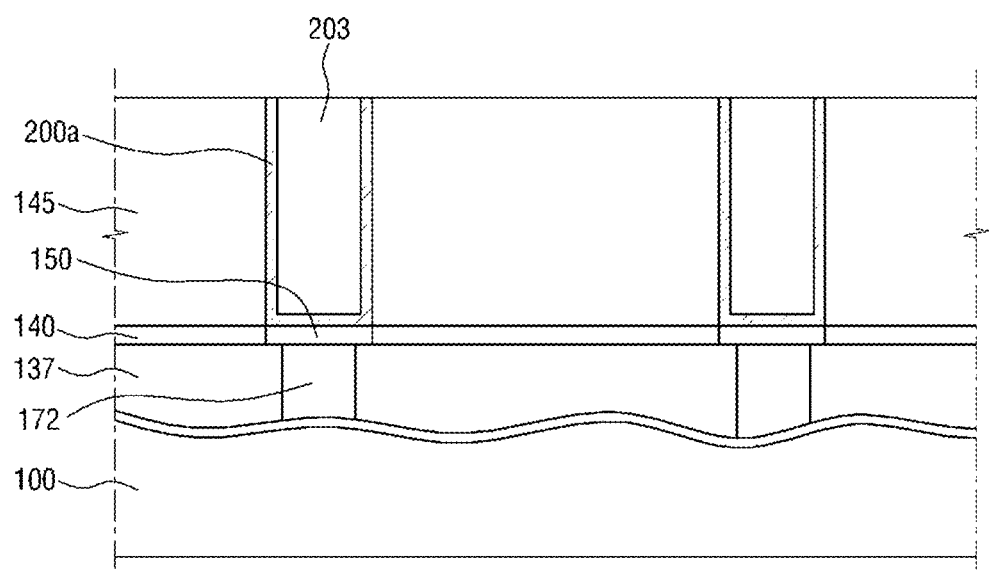

Referring to FIGS. 14 and 15, a sacrificial layer 203 is formed on the first electrode layer 200 to fill the storage node hole (153 of FIG. 12).

The sacrificial layer 203 may be formed of a material having the same properties as the material of the mold layer 145.

After the sacrificial layer 203 has been formed, the sacrificial layer 203 and the first electrode layer 200 are planarized until the top surface of the mold layer 145 is exposed. The planarizing of the sacrificial layer 203 and the first electrode layer 200 may include performing a chemical mechanical polishing (CMP) process.

Once the sacrificial layer 203 and the first electrode layer 200 have been planarized, the lower electrode layer 200*a*, which is cylindrical, may be formed. The lower electrode layer 200*a* may serve as the lower electrode of an OCS-type capacitor.

After the lower electrode layer 200*a* has been formed, a thermal treatment process may be performed on the lower electrode layer 200*a*.

More specifically, by performing a thermal treatment process, the grains of the lower electrode layer 200*a* may be sufficiently grown before the dielectric layer (205*a* of FIG. 17) is formed. That is, after the dielectric layer (205*a* of FIG. 17) has been formed, the growth of the grains of the lower electrode layer 200*a* may not occur any longer, and the properties of the dielectric layer (205*a* of FIG. 17) may not change in subsequent processes.

Figure 16:
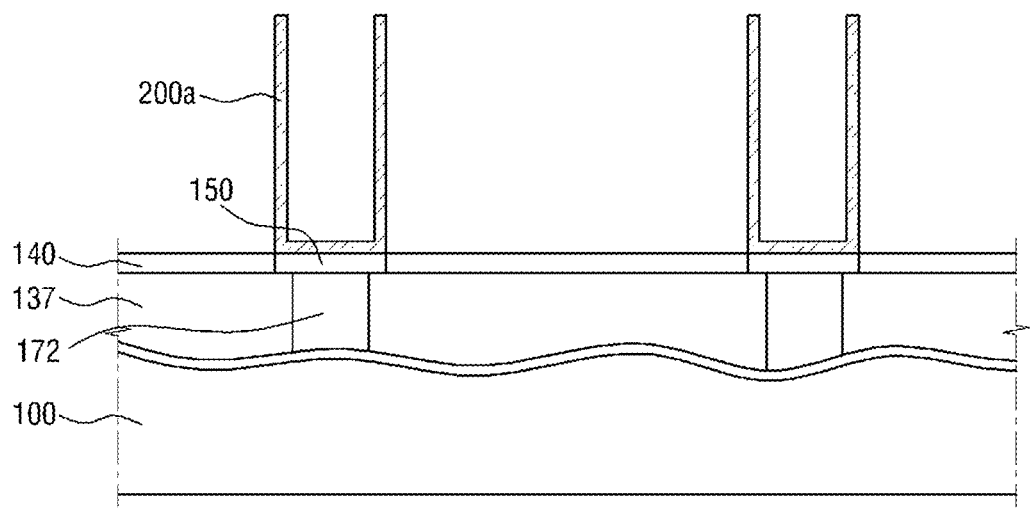

Referring to FIG. 16, the mold layer 145 and the sacrificial layer 203 are removed.

The mold layer 145 and the sacrificial layer 203 are preferably removed by a wet etching process, which does not cause a plasma-induced attack, in order to prevent damage to the lower electrode layer 200*a*.

By removing the mold layer 145 and the sacrificial layer 203, the outer sidewalls and the inner sidewalls of the lower electrode layer 200*a* may both be exposed.

Figure 17:
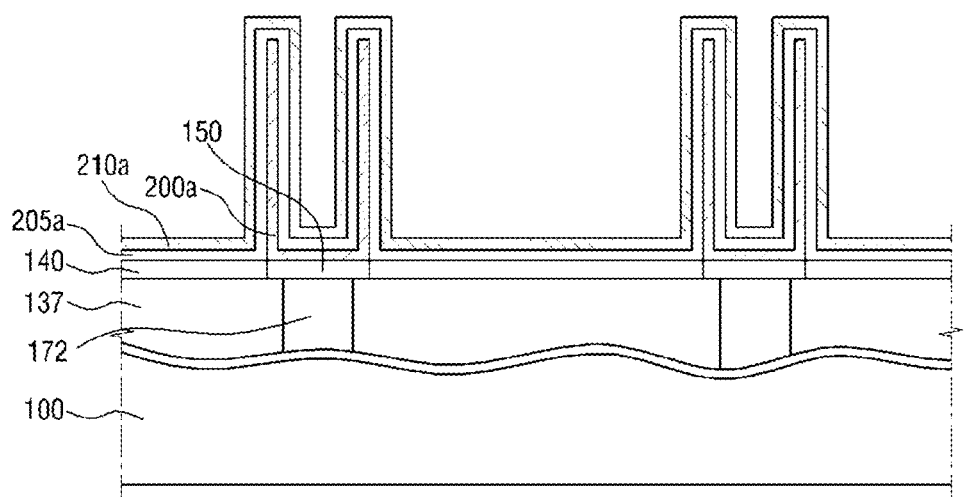

Referring to FIG. 17, the dielectric layer 205*a* may be formed by depositing a two component dielectric material comprising a metal oxide on the lower electrode layer 200*a* and the etching stop layer 140. The dielectric layer 205*a* may comprise a high-k dielectric (i.e., may be highly dielectric).

The dielectric layer 205*a* may be formed by ALD, CVD, or PVD. The dielectric layer 205*a* may also be formed by a thin film forming method according to the present inventive concept.

After the dielectric layer 205*a* has been formed, the upper electrode layer 210*a* may be formed by depositing a material comprising a metal on the dielectric layer 205*a*. The upper electrode layer 210*a* may also be formed by a thin film forming method according to the present inventive concept.

The upper electrode layer 210*a* may be formed along the surface profile of the dielectric layer 205*a* not to entirely fill a gap between the lower electrode layer 200*a* and another lower electrode layer 200*a*.

The upper electrode layer 210*a* may be formed by ALD, CVD, or PVD. The upper electrode layer 210*a* may also be formed by a thin film forming method according to the present inventive concept.

Figure 18:
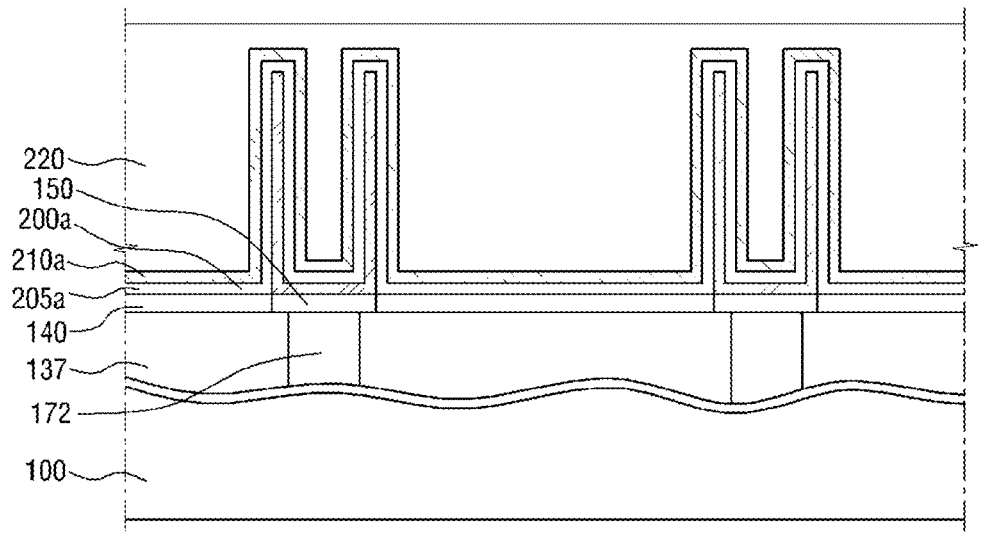

Referring to FIG. 18, the capping layer 220, which covers the entire top surface of the upper electrode layer 210*a*, is formed. The capping layer 220 may be formed to suppress the grain growth and agglomeration of the upper electrode layer 210*a*. To effectively suppress the grain growth of the upper electrode layer 210*a* using the capping layer 220, the capping layer 220 may be formed to fill the gap between the lower electrode layer 200*a* and another lower electrode layer 200*a*.

The capping layer 220 may be formed by one of ALD, CVD, PVD, and spin-coating (in a case in which the capping layer 220 is spin on glass (SOG), for example).

By forming the capping layer 220 in the above-mentioned manner, a semiconductor device of FIG. 6 may be fabricated.

In short, the lower electrode layer 200*a* and the upper electrode layer 210*a* may be formed by a method according to the present inventive concept. Accordingly, the lower electrode layer 200*a* and the upper electrode layer 210*a*, which have a predetermined width, can be formed in a hole with a high aspect ratio, i.e., the storage node hole 153.

As described above, the present inventive concept is not limited to forming a conformal thin film in the storage node hole 153. That is, the present inventive concept is also applicable to forming a conformal thin film in a hole or trench with a high aspect ratio. Thus, the term "opening" may describe any of these features (storage node hole or other type of hole or trench) or other examples of features of a semiconductor device.

An example of a method of fabricating a semiconductor device according to the present inventive concept will hereinafter be described with reference to FIG. 19.

Figure 19:
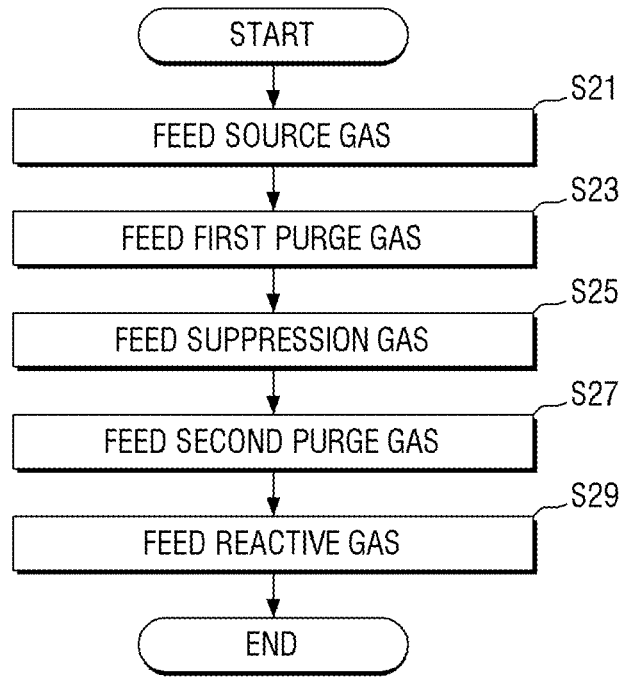
FIG. 19 is a flowchart illustrating a method of fabricating a semiconductor device according to some examples of the present inventive concept.

The example of FIG. 19 is substantially the same as the example of FIG. 1 except that a suppression gas is fed after the feeding of a source gas. Thus, the following description of the example of FIG. 19 will focus mainly on the differences between this example and the example of FIG. 1.

Referring to FIG. 19, the method of fabricating a semiconductor device according to the inventive concept includes feeding a source gas (S21), feeding a first purge gas (S23), feeding a suppression gas (S25), feeding a second purge gas (S27), and feeding a reactive gas (S29).

The steps S21, S23, S25, S27, and S29 are substantially the same as S15, S13, S11, S17, and S19, respectively, of FIG. 1.

However, unlike the example of FIG. 1, the feeding of a suppression gas, i.e., S25, is performed after the feeding of a source gas, i.e., S21. That is, in this example of the inventive concept, the feeding of a suppression gas is performed after the adsorption of a source gas onto a substrate, and thus, the suppression gas may push away the source gas already adsorbed on the substrate to be adsorbed onto the substrate. In this example of the inventive concept, like in the example of FIG. 1, the suppression gas adsorbed on the substrate may prevent the over-adsorption of the source gas in a particular region.

Accordingly, this example of the method of fabricating a semiconductor device according to the present inventive concept can also form a conformal thin film of substantially uniform thickness on a substrate.

An example of a method of fabricating a semiconductor device according to the present inventive concept will hereinafter be described with reference to FIG. 20.

Figure 20:
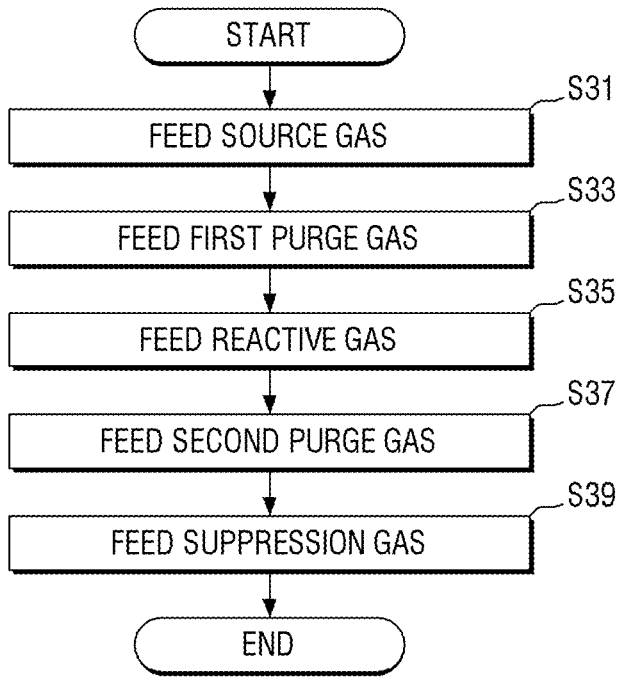
FIG. 20 is a flowchart illustrating a method of fabricating a semiconductor device according to some examples of the present inventive concept.

The example of FIG. 20 is substantially the same as the example of FIG. 1 except that a suppression gas is fed after the feeding of a reactive gas. Thus, the following description of the example of FIG. 20 will focus mainly on the differences between this example and the example of FIG. 1.

Referring to FIG. 20, the method of fabricating a semiconductor device according to the inventive concept includes feeding a source gas (S31), feeding a first purge gas (S33), feeding a reactive gas (S35), feeding a second purge gas (S37), and feeding a suppression gas (S39).

The steps S31, S33, S35, S37, and S39 are substantially the same as S15, S13, S19, S17, and S11, respectively, of FIG. 1.

The feeding of a suppression gas, i.e., S39, is performed after the feeding of a reactive gas, i.e., S35. The suppression gas may push away a source gas and a reactive gas that are over-adsorbed on a substrate. Accordingly, this example of the method of fabricating a semiconductor device according to the present inventive concept can also form a conformal thin film of substantially uniform thickness on a substrate.

Another example of a method of fabricating a semiconductor device according to the present inventive concept will hereinafter be described with reference to FIG. 21.

Figure 21:
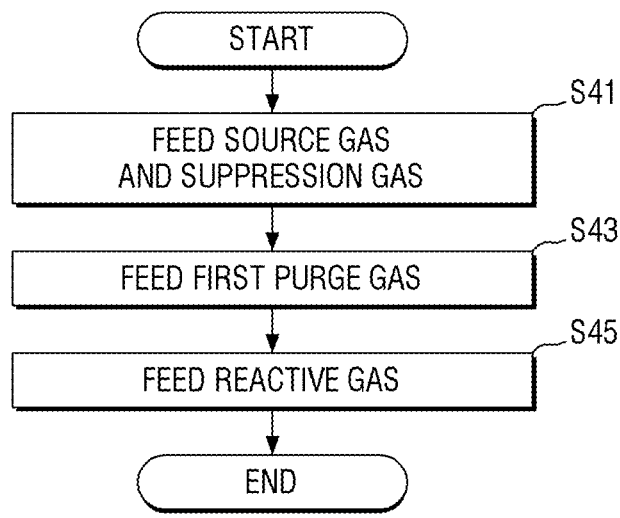
FIG. 21 is a flowchart illustrating a method of fabricating a semiconductor device according to some examples of the present inventive concept.

The example of FIG. 21 is substantially the same as the example of FIG. 1 except that a source gas and a suppression gas are fed together. Thus, the following description of the example of FIG. 21 will focus mainly on the differences between this example and the example of FIG. 1.

Referring to FIG. 21, the method of fabricating a semiconductor device according to the inventive concept includes feeding a source gas and a suppression gas (S41), feeding a first purge gas (S43), and feeding a reactive gas (S45).

Steps S41, S43, and S45 are substantially the same as S15 and S11, S13, and S19, respectively, of FIG. 1.

In this example of the inventive concept, a source gas and a suppression gas may be fed together (S41). The suppression gas may be adsorbed onto a substrate while suppressing the adsorption of the source gas onto the substrate. Accordingly, this example of the method of fabricating a semiconductor device according to the inventive concept can form a conformal thin film of a substantially uniform thickness on the substrate.

Another example of a method of fabricating a semiconductor device according to the present inventive concept will hereinafter be described with reference to FIG. 22.

Figure 22:
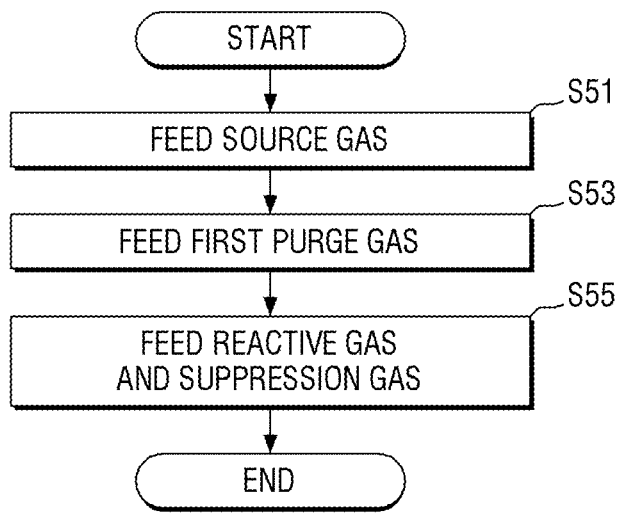
FIG. 22 is a flowchart illustrating a method of fabricating a semiconductor device according to some examples of the present inventive concept.

The example of FIG. 22 is substantially the same as the example of FIG. 1 except that a reactive gas and a suppression gas are fed together. Thus, the following description of the example of FIG. 22 will focus mainly on the difference between this example and the example of FIG. 1.

Referring to FIG. 22, the method of fabricating a semiconductor device according to the inventive concept includes feeding a source gas (S51), feeding a first purge gas (S53), and feeding a reactive gas and a suppression gas (S55).

Steps S51, S53, and S55 are substantially the same as S15, S13, and S19 and S11, respectively, of FIG. 1.

In this example of the inventive concept, a reactive gas and a suppression gas may be fed together (S55). The suppression gas may desorb a source gas already adsorbed on a substrate and purge a source gas over-adsorbed on the substrate. Accordingly, this example of the is method of fabricating a semiconductor device according to the inventive concept can form a conformal thin film on the substrate.

Examples of a semiconductor device fabricating equipment according to the present inventive concept will be described hereinafter with reference to FIGS. 23 and 24.

Some examples of a semiconductor device fabricating equipment according to the present inventive concept will be described hereinafter taking forming a thin film using plasma, as an example. However, the present inventive concept is not limited to forming a thin film using plasma. That is, a semiconductor device fabricating equipment according to the present inventive concept is also applicable to a semiconductor device fabricating equipment forming a thin film without using plasma, for example, semiconductor device fabricating equipment using a thin film using heat.

Figure 23:
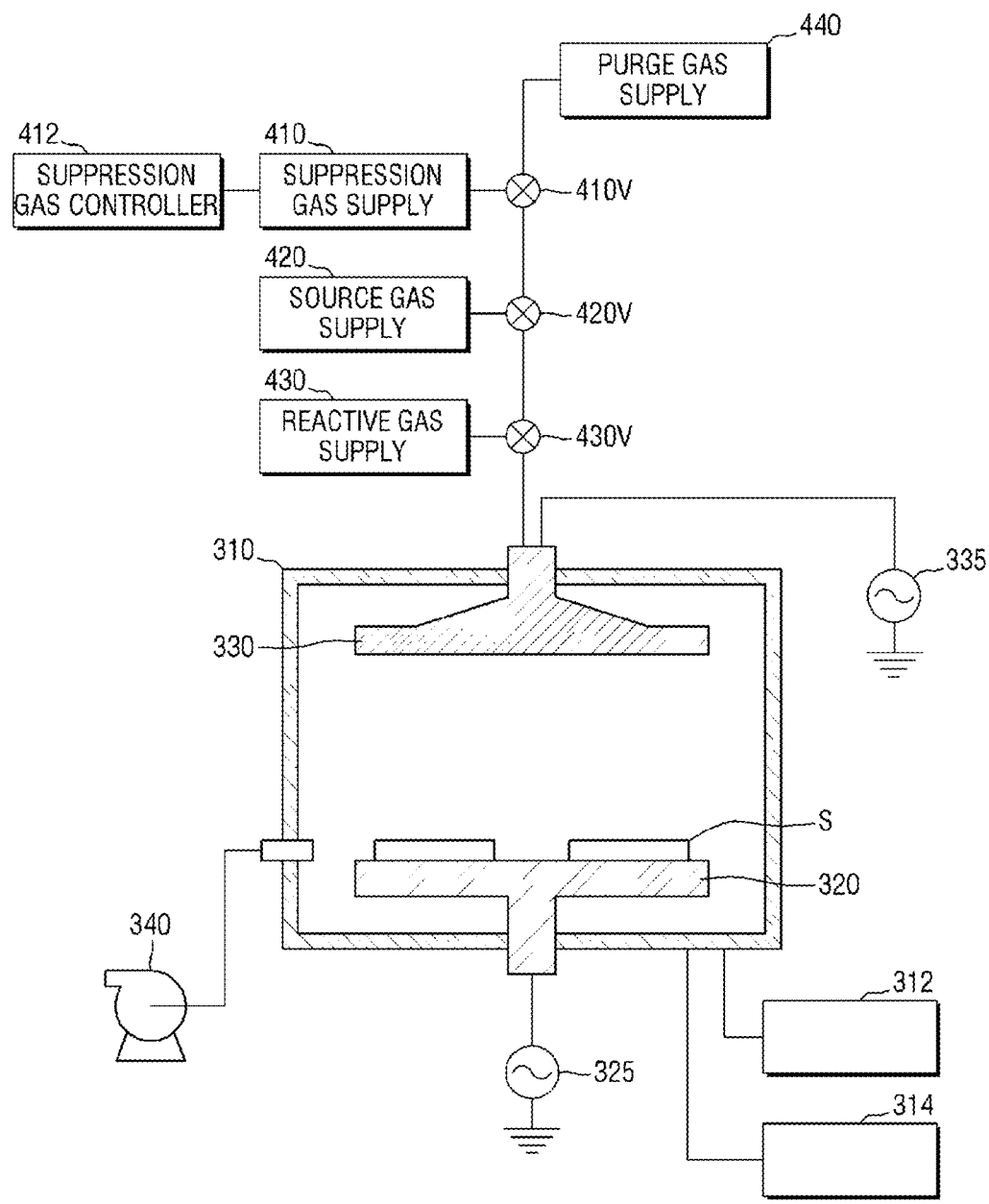
FIG. 23 is a schematic view illustrating semiconductor device fabricating equipment according to some examples of the present inventive concept.

FIG. 23 is a schematic view illustrating semiconductor device fabricating equipment according to some examples of the present inventive concept.

Referring to FIG. 23, the semiconductor device fabricating equipment includes a chamber 310, a substrate support 320, a gas injector 330, a suppress gas supply 410, a source gas supply 420, a reactive gas supply 430, and a purge gas supply 440.

The chamber 310 may be cylindrical and may include a reaction space. The chamber 310 may further include a pump 340, a pressure controller 312, and a heater 314.

The pump 340 may be connected to the chamber 310 to evacuate impurities and reaction byproducts from the chamber 310. Also, the pump 340 may form and maintain a vacuum within the chamber 310.

The pressure controller 312 may control the pressure inside the chamber 310. Also, the heater 314 may heat the inside of the chamber 310 to improve reactivity. Although not is specifically illustrated, the chamber 310 may further include a cooler for cooling the heated chamber 310.

The substrate support 320 may be disposed in the chamber 310 to house the substrate S. The substrate support 320 may be fixed to a lower portion of the chamber 310, but may be lifted and/or rotated within the chamber 310 as necessary.

The substrate S may be a silicon substrate, but the present inventive concept is not limited thereto. That is, various other substrates where a thin film can be formed may be used as the substrate S.

Although not specifically illustrated, the substrate support 320 may include a device for loading the substrate S on the top surface of the substrate support 320. For example, the substrate support 320 may include a plurality of lift pin portions for loading and unloading the substrate S.

The substrate support 320 may be connected to a lower power source 325. The lower power source 325 may be connected to the substrate support 320 to provide a voltage to the substrate support 320. The lower power source 325 may be an alternating current (AC) power source, but the present inventive concept is not limited thereto. That is, alternatively, the lower power source 325 may be a direct current (DC) power source.

The gas injector 330 may be disposed in the chamber 310 and may inject a gas into the chamber 310. More specifically, the gas injector 330 may be connected to the source gas supply 420, the reactive gas supply 430, the suppression gas supply 410, or the purge gas supply unit 440 to inject various gases into the chamber 310. The gas injector 330 may be fixed to an upper portion of the chamber 310, but may be lifted and/or rotated within the chamber 310 as necessary.

The gas injector 330 may be connected to an upper power source 335. The upper power source 335 may be connected to the gas injector 330 to provide a voltage to the gas injector 330. The upper power source 335 may be an AC power source, but the present inventive concept is not limited thereto. That is, alternatively, the upper power source 335 may be a DC power source.

In some examples, the lower power supply 325 and the upper power supply 335 may form an electric field inside the chamber 310. For example, the lower power supply 325 and the upper power supply 335 may form an electric field inside the chamber 310 through the substrate support 320 and the gas injector 330.

Accordingly, the gas injected into the chamber 310 may be plasmatized. For example, a reactive gas supplied into the chamber 310 may be plasmatized by the electric field formed by the lower power supply 325 and the upper power supply 335. The plamatized gas may have an unstable energy state but may be highly reactive.

The suppression gas supply 410 may be connected to the chamber 310 and may supply a suppression gas into the chamber 310. In some examples, the suppression gas supply 410 may be controlled by a first valve 410V and may be connected to the gas injector 330 to supply the suppression gas into the chamber 310.

The source gas supply 420 may be connected to the chamber 310 and may supply a source gas into the chamber 310. In some examples, the source gas supply 420 may be controlled by a second valve 420V and may be connected to the gas injector 330 to supply the source gas into the chamber 310.

The reactive gas supply 430 may be connected to the chamber 310 and may supply a reactive gas into the chamber 310. In some examples, the reactive gas supply 430 may be controlled by a third valve 430V and may be connected to the gas injector 330 to supply the reactive gas into the chamber 310.

The purge gas supply 440 may be connected to the chamber 310 and may supply a purge gas into the chamber 310. In some examples, the purge gas supply 440 may be controlled by the first, second, and third valves 410V, 420V, and 430V and may be connected to the gas injector 330 to supply the purge gas into the chamber 310.

The semiconductor device fabricating equipment may include a suppression gas controller 412, which controls the vapor pressure of the suppression gas. The suppression gas controller 412 may be connected to the suppression gas supply 410 to control the vapor pressure of the suppression gas.

More specifically, the suppression gas controller 412 may include a device for heating or cooling the suppression gas. In a case where the suppression gas controller 412 heats the suppression gas, the vapor pressure of the suppression gas may increase. In this case, the suppression gas can suppress excessive adsorption of the source gas to a large extent. On the other hand, in a case where the suppression gas controller 412 cools the suppression gas, the vapor pressure of the suppression gas may decrease. In this case, the suppression gas can suppress excessive adsorption of the source gas to a lesser extent. That is, the suppression gas controller 412 can control the suppression gas supplied into the chamber 310 and can thus control the formation of a conformal thin film.

The operation of the semiconductor device fabricating equipment will hereinafter be described with reference to FIG. 24.

Figure 24:
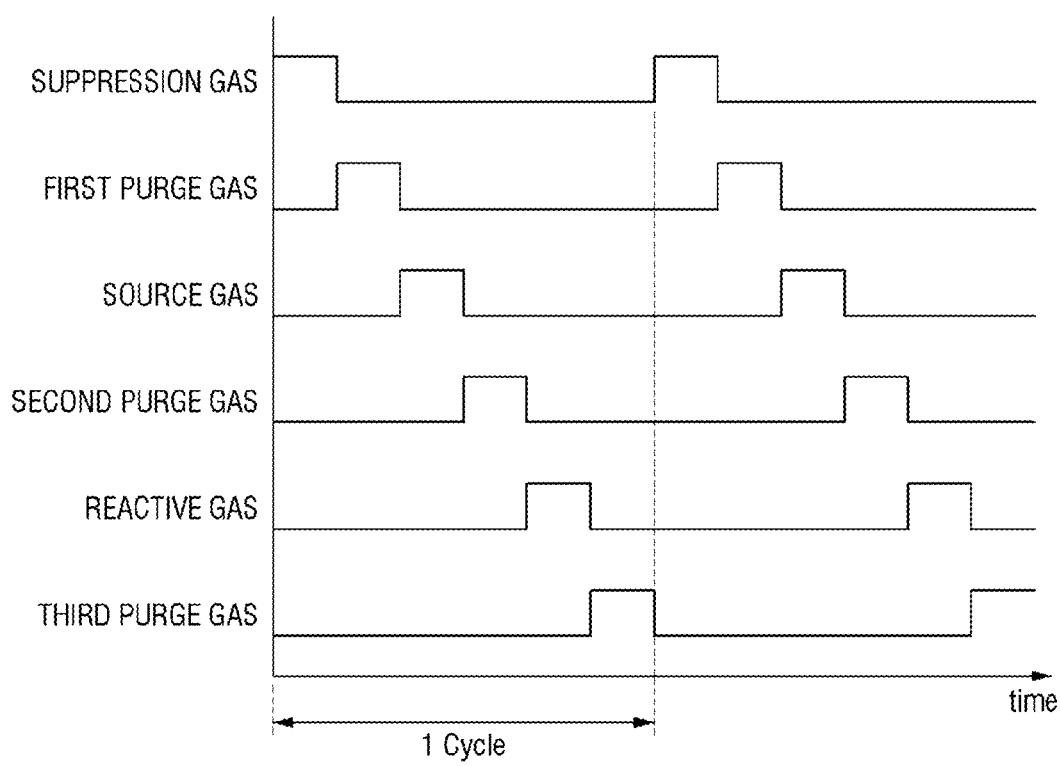
FIG. 24 is a timing diagram illustrating the operation of the semiconductor device fabricating equipment of FIG. 23.

FIG. 24 is a timing diagram illustrating the operation of the semiconductor device fabricating equipment of FIG. 23. More specifically, FIG. 24 may be, for example, a timing diagram showing the timing of the supply of a gas into the chamber 310 over periods of atomic layer deposition.

Referring to FIG. 24, the first valve 410V may provide a pipe for the suppression gas. That is, the suppression gas may be supplied from the suppression gas supply 410 onto the substrate S in the chamber 310.

Thereafter, the first, second, and third valves 410V, 420V, and 430V may block the suppression gas and provide a pipe for a first purge gas. That is, the first purge gas may be supplied from the purge gas supply 440 onto the substrate S in the chamber 310. The first purge gas may purge the suppression gas not adsorbed on the substrate S.

Thereafter, the second valve 420V may block the first purge gas and provide a pipe for the source gas. That is, the source gas may be supplied from the source gas supply 420 onto the substrate S in the chamber 310.

Thereafter, the first, second, and third valves 410V, 420V, and 430V may block the source gas and provide a pipe for a second purge gas. That is, the second purge gas may be supplied from the purge gas supply 440 onto the substrate S in the chamber 310. The second purge gas may purge the source gas not adsorbed on the substrate S.

Thereafter, the third valve 430V may block the second purge gas and provide a pipe for the reactive gas. That is, the reactive gas may be supplied from the reactive gas supply 430 onto the substrate S in the chamber 310. Accordingly, the reactive gas can react with the source gas adsorbed on the substrate S. Then, the reactive gas can be plasmatized in the chamber 310 by the lower power supply 325 and the upper power supply 335. The plasmaized reactive gas can react better with the source gas. However, as described above, the formation of a thin film with the use of plasma is merely exemplary. For example, the reactive gas may react with the source gas using heat provided to the chamber 310.

Thereafter, the first, second, and third valves 410V, 420V, and 430V may block the reactive gas and provide a pipe for a third purge gas. That is, the third purge gas may be supplied from the purge gas supply 440 onto the substrate S in the chamber 310. Thus, the third purge gas can purge the unreacted source gas and the reactive gas.

Accordingly, the semiconductor device fabricating equipment can provide a semiconductor device with improved reliability.

Examples of a semiconductor device fabricating equipment according to the present inventive concept will be described hereinafter with reference to FIG. 25.

Figure 25:
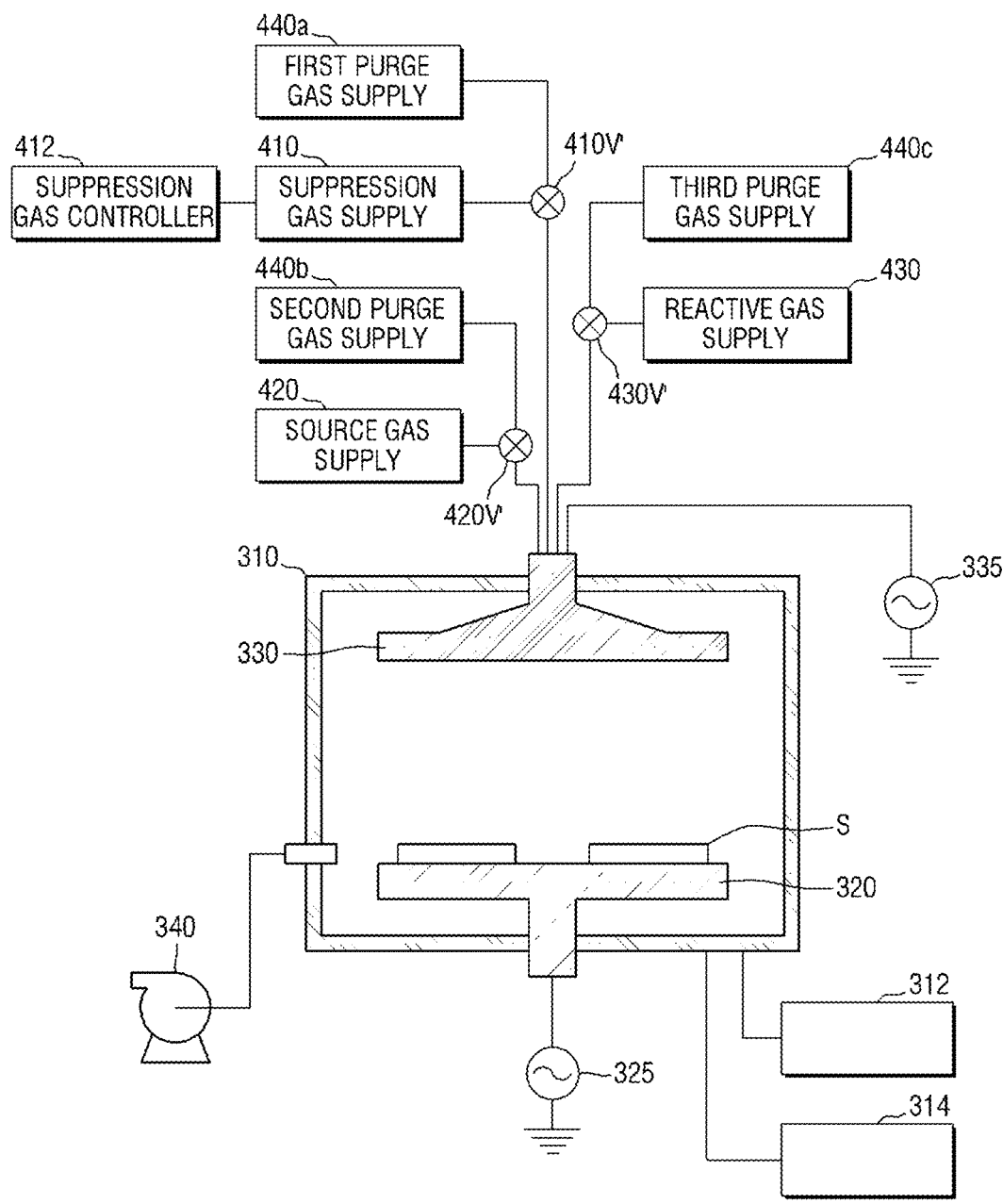
FIG. 25 is a schematic view illustrating semiconductor device fabricating equipment according to some examples of the present inventive concept.

FIG. 25 is a schematic view illustrating semiconductor device fabricating equipment according to some examples of the present inventive concept.

The semiconductor device fabricating equipment according to the example of FIG. 25 will be described hereinafter, focusing mainly on differences with this example and the example of FIGS. 23 and 24.

Referring to FIG. 25, the semiconductor device fabricating equipment includes first, second, and third purse gas supplies 440a, 440b, and 440c.

The first, second, and third purse gas supplies 440a, 440b, and 440c may be connected to a suppress gas supply 410, a source gas supply 420, and a reactive gas supply 430, respectively.

More specifically, the first purge gas supply 440a may be connected to a chamber 310 and the suppression gas supply 410. Accordingly, the first purge gas supply 440a can supply a first purge gas for purging a suppression gas in the chamber 310.

A first valve 410V' may be connected to the first purge gas supply 440a and the suppression gas supply 410. That is, the first valve 410V' may provide a pipe for the first purge gas or the suppression gas. For example, the first valve 410V' may block the first purge gas and provide a pipe for the suppression gas, or may block the suppression gas and provide a pipe for the first purge gas.

The second purge gas supply 440b may be connected to the chamber 310 and the source gas supply 420. Accordingly, the second purge gas supply 440b can supply a second purge gas for purging a source gas in the chamber 310.

A second valve 420V' may be connected to the second purge gas supply 440b and the source gas supply 420. That is, the second valve 420V' may provide a pipe for the second purge gas or the source gas. For example, the second valve 420V' may block the second purge gas and provide a pipe for the source gas, or may block the source gas and provide a pipe for the second purge gas.

The third purge gas supply 440c may be connected to the chamber 310 and the reactive gas supply 430. Accordingly, the third purge gas supply 440c can supply a third purge gas for purging a reactive gas in the chamber 310.

The third valve 430V' may be connected to the third purge gas supply 440c and the reactive gas supply 430. That is, the third valve 430V' may provide a pipe for the third purge gas or the reactive gas. For example, the third valve 430V' may block the third purge gas and provide a pipe for the reactive gas, or may block the reactive gas and provide a pipe for the third purge gas.

Semiconductor device fabricating equipment according to some examples of the present inventive concept will hereinafter be described with reference to FIG. 26.

Figure 26:
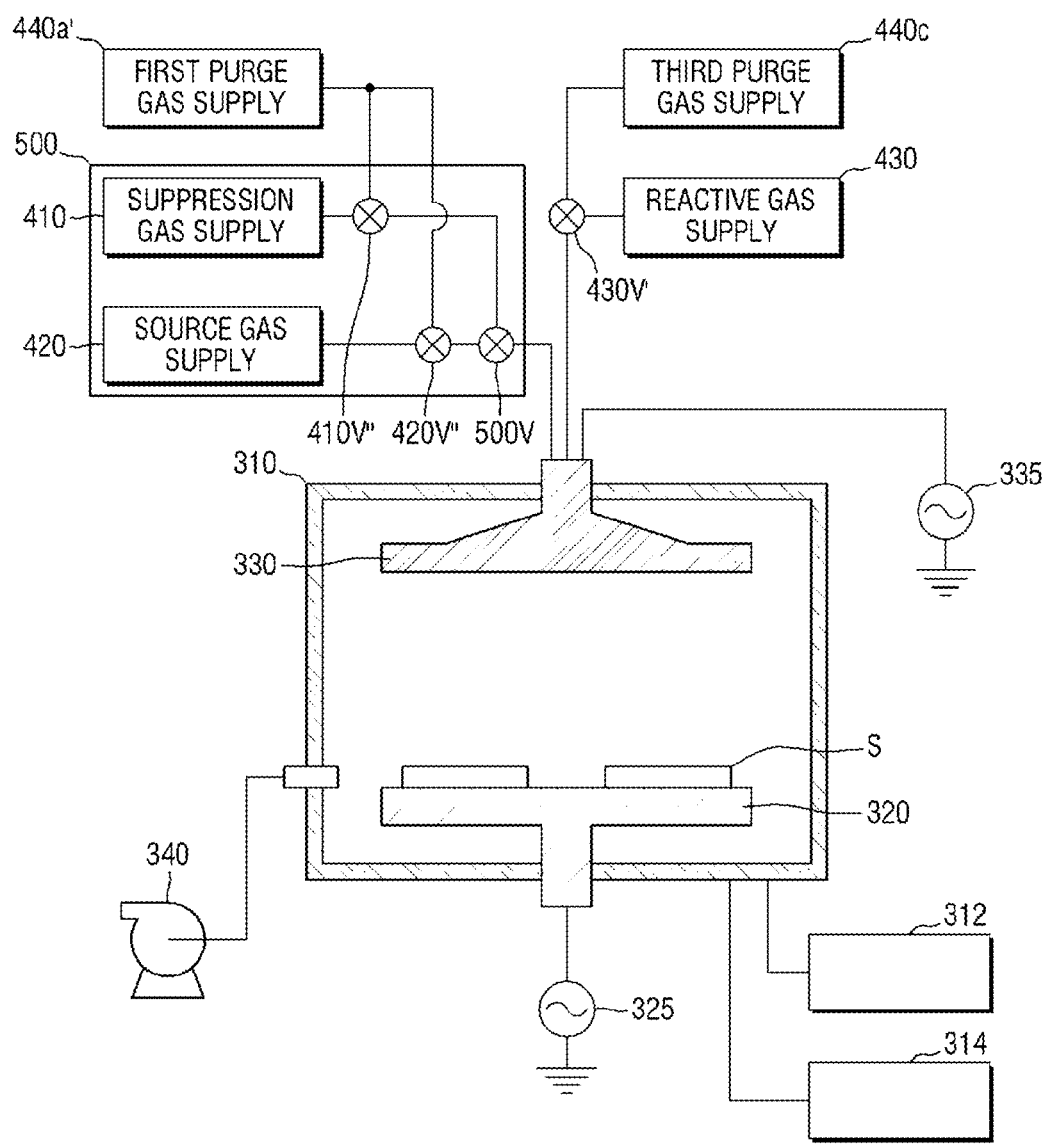
FIG. 26 is a schematic view illustrating semiconductor device fabricating equipment according to some examples of the present inventive concept.

FIG. 26 is a schematic view illustrating semiconductor device fabricating equipment according to some examples of the present inventive concept.

The semiconductor device fabricating equipment according to the example of FIG. 26 will hereinafter be described, focusing mainly on differences with the semiconductor device fabricating equipment according to any one of the examples of FIGS. 23 through 25.

Referring to FIG. 26, the semiconductor device fabricating equipment includes a gas box 500.

A suppress gas supply 410 and a source gas supply 420 are disposed in the gas box 500. That is, the gas box 500 may provide at least one of a suppression gas and a source gas to a chamber 310.

More specifically, the gas box 500 may include a fourth valve 500V. The fourth valve 500V may be connected to the suppression gas supply 410 and the source gas supply 420. That is, the fourth valve 500V may provide a pipe for at least one of the suppression gas and the source gas. For example, the fourth valve 500V may block the source gas and provide a pipe for the suppression gas, or may block the suppression gas or provide a pipe for the source gas. Alternatively, the fourth valve 500V may provide a pipe for both the suppression gas and the source gas.

A first purge gas supply 440a' may be connected to the chamber 310 and the gas box 500. More specifically, the first purge gas supply 440a' may be connected to the suppression gas supply 410 and the source gas supply 420. Accordingly, the first purge gas supply 440a' can purge at least one of the suppression gas and the source gas supplied into the chamber 310.

Although the present inventive concept has been particularly shown and described with reference to examples thereof, it will be understood by those of ordinary skill in the art that various changes in form and details may be made to the disclosed examples without departing from the spirit and scope of the present inventive concept as defined by the following claims. It is therefore desired that the disclosed examples be considered in all respects as illustrative and not restrictive, reference being made to the appended claims rather than the foregoing description to indicate the scope of the inventive concept.

What is claimed is:

1. A method of fabricating a semiconductor device, comprising:
   providing a substrate; and
   forming a thin film on the substrate by a process comprising:
   feeding a suppression gas onto the substrate;
   feeding a source gas;
   feeding a reactive gas; and
   feeding a purge gas comprising an inert gas,
   wherein the suppression gas suppresses a physical adsorption of the source gas by the substrate,
   the source gas comprises a titanium-based compound,
   the reactive gas comprises a nitride-based compound,
   the suppression gas comprises at least one of an alkyl halide, an alkenyl halide, an alkynyl halide, an alkene and an alkyne,
   each of the alkyl halide, the alkenyl halide, the alkynyl halide, the alkene and the alkyne comprises 1 to 10 carbon atoms, and
   each of the alkyl halide, the alkenyl halide, and the alkynyl halide further comprises 1 to 10 halogen atoms.

2. The method of claim 1, wherein the suppression gas does not comprise oxygen and does not comprise nitrogen.

3. The method of claim 1, wherein the feeding the suppression gas comprises feeding the suppression gas before or after the feeding of the source gas.

4. The method of claim 1, wherein the feeding the suppression gas, comprises feeding the suppression gas after the feeding of the reactive gas.

5. The method of claim 1, wherein
   the purge gas comprises a first gas, a second gas and a third gas, and
   the feeding of the purge gas, comprises feeding of the first gas after the feeding the suppression gas, feeding of the second gas after the feeding the source gas, and feeding of the third gas after the feeding the reactive gas.

6. The method of claim 1, wherein the suppression gas is fed together with the source gas.

7. The method of claim 1, wherein the suppression gas is fed together with the reactive gas.

8. A method of manufacturing a semiconductor device, the method comprising:
   supporting an intermediate structure of a semiconductor device in a process chamber, the intermediate structure having an upper surface and an opening therein extending from the upper surface so as to have an aspect ratio, wherein the intermediate structure includes an internal bottom surface delimiting a bottom of the opening and an internal side surface delimiting a side of the opening; and a film forming process of conformally forming a film of substantially uniform thickness on the intermediate structure including on the top surface and on the internal bottom surface of the structure, the film forming process comprising:

feeding, into the process chamber, a source gas that is a precursor of the film and at least some of which is adsorbed by the structure at the top surface and internal bottom surface of the intermediate structure, feeding, into the process chamber, a reactive gas that is a precursor of the film and reacts chemically with the source gas, and feeding, into the process chamber, a suppression gas which is not a precursor of the film, which is not reactive with the source gas, and at least some of which is adsorbed by the top and internal bottom surface of the intermediate structure, and feeding, into the process chamber, inert gas to purge the chamber of at least some of the gas that is in the process chamber, wherein the feeding of inert gas is carried out at one or more points in the film forming process after the source gas has been fed into the process chamber, wherein the source gas comprises a titanium-based compound, the reactive gas comprises a nitride-based compound, the suppression gas comprises at least one of an alkyl halide, an alkenyl halide, an alkynyl halide, an alkene and an alkyne, each of the alkyl halide, the alkenyl halide, the alkynyl halide, the alkene and the alkyne comprises 1 to 10 carbon atoms, and each of the alkyl halide, the alkenyl halide, and the alkynyl halide further comprises 1 to 10 halogen atoms.

9. The method of claim 8, wherein the film forming process comprises a cycle of feeding an amount of the suppression gas into the process chamber after the intermediate structure has been loaded into the process chamber and before any of the source gas, any of the reactive gas and any of the inert gas have been fed into the process chamber.

10. The method of claim 8, wherein the film forming process comprises a cycle of feeding an amount of the source gas into the process chamber after the intermediate structure has been loaded into the process chamber and before any of the suppression gas, any of the reactive gas and any of the inert gas have been fed into the process chamber.

11. The method of claim 8, wherein the film forming process comprises a cycle of feeding amounts of the source gas and the suppression gas into the process chamber after the intermediate structure has been loaded into the process chamber and before any of the reactive gas has been fed into the process chamber.

12. The method of claim 8, wherein the film forming process conformally forms a film of an electrically conductive material comprising titanium (Ti) and nitrogen (N) on the intermediate structure, and the feeding of a source gas into the process chamber comprises feeding a gas comprising titanium (Ti) into the process chamber, the feeding of a reactive gas into the process chamber comprises feeding a gas comprising nitrogen (N) into the process chamber, and the feeding of a suppression gas into the process chamber comprises feeding a gas comprising a halogen into the process chamber.

13. The method of claim 8, wherein the film is a nitride and the suppression gas does not comprise oxygen.

14. The method of claim 8, wherein the film is an oxynitride and the suppression gas does not comprise oxygen and does not comprise nitrogen.

\* \* \* \* \*